US011778884B2

(12) United States Patent
Lee et al.

(10) Patent No.: US 11,778,884 B2
(45) Date of Patent: Oct. 3, 2023

(54) DISPLAY DEVICE HAVING FLEXIBLE AND ENHANCED BLACK COLOR SENSE CHARACTERISTICS

(71) Applicant: Samsung Display Co., Ltd., Yongin-Si (KR)

(72) Inventors: Hyeonbum Lee, Hwaseong-si (KR); Haseok Jeon, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 334 days.

(21) Appl. No.: 17/079,686

(22) Filed: Oct. 26, 2020

(65) Prior Publication Data

US 2021/0273021 A1 Sep. 2, 2021

(30) Foreign Application Priority Data

Feb. 27, 2020 (KR) .................. 10-2020-0024477

(51) Int. Cl.
*H10K 59/38* (2023.01)
*H10K 50/86* (2023.01)
*H10K 59/40* (2023.01)
*H10K 102/00* (2023.01)

(52) U.S. Cl.
CPC ........... *H10K 59/38* (2023.02); *H10K 50/865* (2023.02); *H10K 59/40* (2023.02); *H10K 2102/311* (2023.02)

(58) Field of Classification Search
USPC .................................................. 257/88, 40
See application file for complete search history.

(56) References Cited

U.S. PATENT DOCUMENTS

| | | | |
|---|---|---|---|
| 9,595,548 B2 | 3/2017 | Yu et al. | |
| 9,637,683 B2 | 5/2017 | Lee et al. | |
| 10,466,530 B2 | 11/2019 | Lee et al. | |
| 10,509,249 B2 | 12/2019 | Bae et al. | |
| 2003/0107314 A1* | 6/2003 | Urabe | H10K 50/865 |
| | | | 313/506 |
| 2016/0378224 A1* | 12/2016 | Kwon | G06F 3/0445 |
| | | | 345/174 |
| 2018/0182814 A1 | 6/2018 | Kim et al. | |

(Continued)

FOREIGN PATENT DOCUMENTS

| | | |
|---|---|---|
| KR | 1020090083197 A | 8/2009 |
| KR | 1020160091523 A | 8/2016 |

(Continued)

*Primary Examiner* — Nduka E Ojeh
(74) *Attorney, Agent, or Firm* — CANTOR COLBURN LLP

(57) ABSTRACT

A display device includes a display panel and a reflection prevention unit. The reflection prevention unit includes a partition pattern overlapping a surrounding unit and having first, second, third, fourth, fifth, and sixth openings corresponding to first, second, third, fourth, fifth, and sixth light emitting areas defined therein, a first color filter overlapping the first light emitting area and the fourth light emitting area, a second color filter overlapping the second light emitting area and the third light emitting area, and a third color filter overlapping the fifth light emitting area and the sixth light emitting area. A portion of the third color filter, which is disposed in the peripheral area, is disposed on the third color filter.

19 Claims, 18 Drawing Sheets

(56) References Cited

U.S. PATENT DOCUMENTS

2019/0043421 A1* 2/2019 Yang .................... G09G 3/2074
2021/0175476 A1* 6/2021 Oh ........................ G06F 3/0412

FOREIGN PATENT DOCUMENTS

| KR | 1020180073194 A | 7/2018 |
| KR | 1020190004871 A | 1/2019 |
| KR | 1020190016631 A | 2/2019 |

* cited by examiner

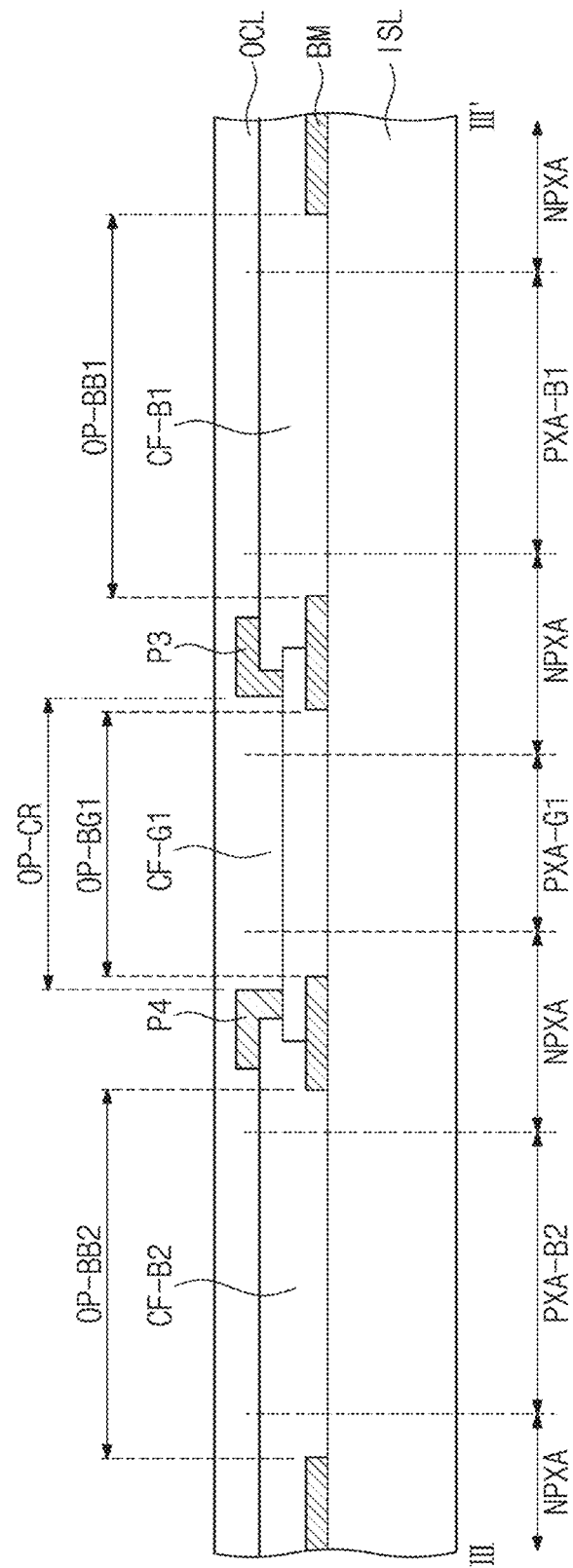

DISPLAY DEVICE HAVING FLEXIBLE AND ENHANCED BLACK COLOR SENSE CHARACTERISTICS

This application claims priority to Korean Patent Application No. 10-2020-0024477, filed on Feb. 27, 2020, and all the benefits accruing therefrom under 35 U.S.C. § 119, the content of which in its entirety is herein incorporated by reference.

BACKGROUND

1. Field

Embodiments of the invention herein relate to a display device, and more particularly, to a display device including a color filter.

2. Description of the Related Art

Electronic devices such as a smartphone, a tablet, a notebook computer, a navigator for a vehicle, and a smart television, are being developed. These electronic devices are generally provided with display devices for providing information.

A reflection phenomenon caused by external natural light may occur in the display devices. Such a reflection phenomenon lowers visibility. In order to prevent the reflection phenomenon, the display devices may include an optical film.

SUMMARY

Embodiments of the invention provide a display device having flexible and enhanced black color sense characteristics.

An embodiment of the invention provides a display panel including a first pixel row including a first light emitting area which emits first color light and a second light emitting area which emits second color light, a second pixel row including a third light emitting area which emits the second color light and is arranged with the first light emitting area within a column direction and a fourth light emitting area which emits the first color light and is arranged with the second light emitting area within the column direction, a third pixel row disposed between the first pixel row and the second pixel row and including fifth and sixth light emitting areas, each of which emits third color light, and a peripheral area adjacent to the first, second, third, fourth, fifth, and sixth light emitting areas, and a reflection prevention unit disposed on the display panel, where the reflection prevention unit includes a partition pattern which overlaps the peripheral area, and in which first, second, third, fourth, fifth, and sixth openings respectively corresponding to the first, second, third, fourth, fifth, and sixth light emitting areas are defined, a first color filter overlapping the first light emitting area and the fourth light emitting area, a second color filter overlapping the second light emitting area and the third light emitting area, and a third color filter overlapping the fifth light emitting area and the sixth light emitting area, where a portion of the first color filter, which is disposed in the peripheral area, is disposed on the third color filter and overlaps the third color filter.

In an embodiment, a portion of the second color filter, which is disposed in the peripheral area, may be disposed on the third color filter and overlap the third color filter.

In an embodiment, the first color light may be one of red light and blue light, the second color light may be another between the red light and blue light, and the third color light may be green light.

In an embodiment, a size of the first light emitting area may be smaller than a size of the second light emitting area and a size of the third light emitting area, and larger than a size of the fifth light emitting area and a size of the sixth light emitting areas.

In an embodiment, the display device is foldable.

In an embodiment, the display device may further include an input sensor which is disposed between the display panel and the reflection prevention unit, and provides a base surface.

In an embodiment, the partition pattern may contact the base surface, and each of a portion of the first color filter, a portion of the second color filter, and a portion of the third color filter, which are disposed in the peripheral area, may overlap the partition pattern.

In an embodiment, a portion of the third color filter, which is disposed in the peripheral area, may be disposed on the partition pattern, and a portion of the first color filter, which is disposed in the peripheral area, may overlap the portion of the third color filter.

In an embodiment, the fifth light emitting area may be disposed inside an area defined by the first light emitting area, the second light emitting area, the third light emitting area, and the fourth light emitting area, and an opening which corresponds to the fifth light emitting area and exposes the third color filter may be defined in the first color filter.

In an embodiment, the first color filter may include a first part corresponding to the first light emitting area, a second part corresponding to the fourth light emitting area, and first and second bridge parts extending from the first part to the second part.

In an embodiment, the second color filter may include one side color filter corresponding to the second light emitting area and another side color filter corresponding to the third light emitting area, and the one side color filter and the other side color filter may be separated with the first and second bridge parts therebetween.

In an embodiment, the one side color filter may be separated from the first and second bridge parts in a plan view, and a portion of the third color filter may be exposed from the first color filter and the second color filter through a separated area.

In an embodiment of the invention, a display device includes a display panel including first group pixel rows, each of the first group pixel rows including a first light emitting area which emits red light and a second light emitting area which emits blue light, and second group pixel rows, each of the second group pixel rows including a third light emitting area and a fourth light emitting area which emit green light, where the second group pixel rows are alternately arranged with the first group pixel rows within a column direction crossing an extension direction of the first group pixel rows, and a reflection prevention unit disposed on the display panel, where the reflection prevention unit includes a first color filter overlapping the first light emitting area, a second color filter overlapping the second light emitting area, and a third color filter overlapping the third light emitting area and the fourth light emitting area, where an opening corresponding to the third light emitting area is be defined in at least one of the first color filter and the second color filter, and a color filter in which the opening is defined among the first color filter and the second color filter is disposed on the third light emitting.

In an embodiment of the invention, a display device includes a display panel including first and second pixel rows including red light emitting areas and blue light emitting areas alternately disposed along a row direction, and a third pixel row including a plurality of green light emitting areas which emit green light and are disposed between the first and second pixel rows within a column direction crossing the row direction, and a reflection prevention unit disposed on the display panel, where the reflection prevention unit includes a red color filter overlapping the red light emitting areas, a blue color filter overlapping the blue light emitting areas, and a green color filter overlapping the green light emitting areas, where a plurality of openings corresponding to the green light emitting areas is defined in the red color filter, and the red color filter is disposed on the green color filter.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings:

FIGS. 7C and 7D are plan views taken along line III-III' of FIG. 7A;

DETAILED DESCRIPTION

Figure 1A:
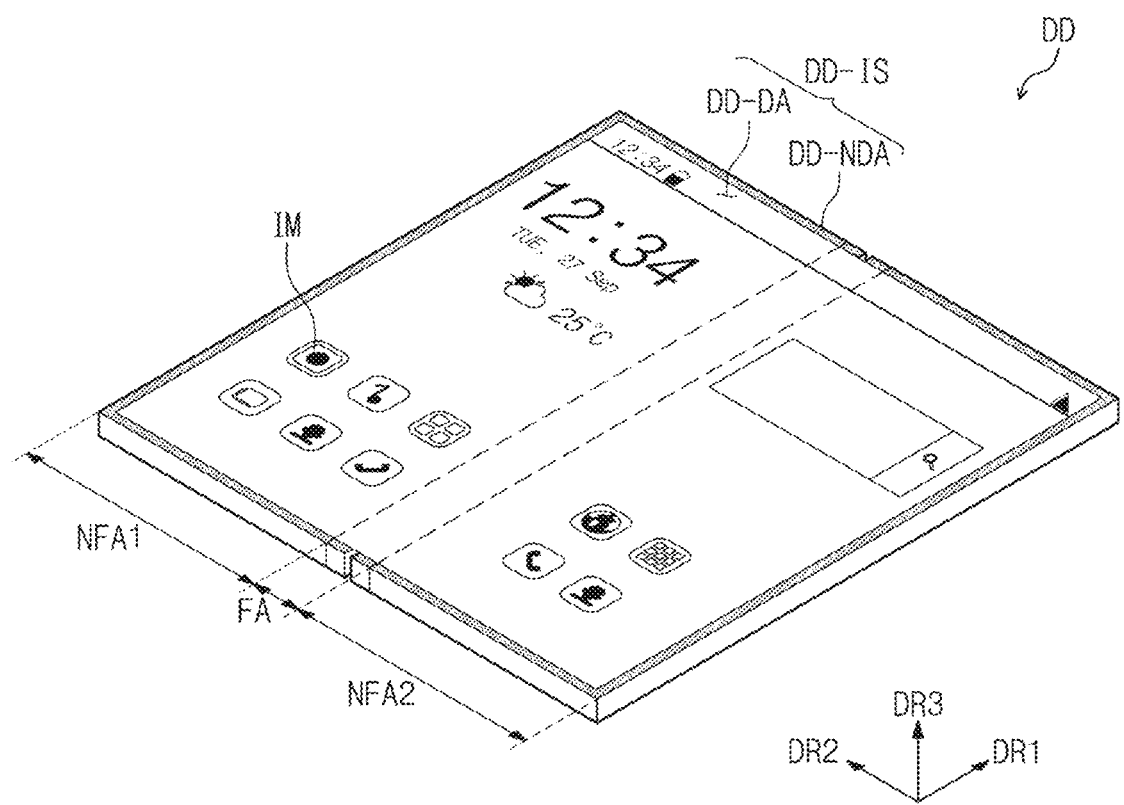
FIGS. 1A to 1C are perspective views of an embodiment of a display device according to the invention.

It will be understood that when an element or layer is referred to as being "on", "connected to" or "coupled to" another element or layer, it can be directly on, connected or coupled to the other element or intervening third elements may be present.

Like reference numerals in the drawings refer to like elements. In addition, in the drawings, the thickness and the ratio and the dimension of the element are exaggerated for effective description of the technical contents. The term "and/or" includes any and all combinations of one or more of the associated items.

Terms such as first, second, and the like may be used to describe various components, but these components should not be limited by the terms. These terms are only used to distinguish one element from another. For instance, a first component may be referred to as a second component, or similarly, a second component may be referred to as a first component, without departing from the scope of the invention. As used herein, the singular forms "a," "an," and "the" may be intended to include the plural forms as well, unless the context clearly indicates otherwise.

In addition, the terms such as "under", "lower", "on", and "upper" are used for explaining associations of items illustrated in the drawings. It will be understood that the spatially relative terms are intended to encompass different orientations of the device in use or operation in addition to the orientation depicted in the drawing figures.

It will be further understood that the terms "includes" and/or "including", when used in this specification, specify the presence of stated features, integers, steps, operations, elements, components or combinations thereof, but do not preclude the presence or addition of one or more other features, integers, steps, operations, elements, components, or combinations thereof.

Unless otherwise defined, all terms (including technical and scientific terms) used herein have the same meaning as commonly understood by one of ordinary skill in the art to which embodiments belong. In addition, it will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Hereinafter, embodiments of the invention will be described with reference to the accompanying drawings.

Figure 1B:
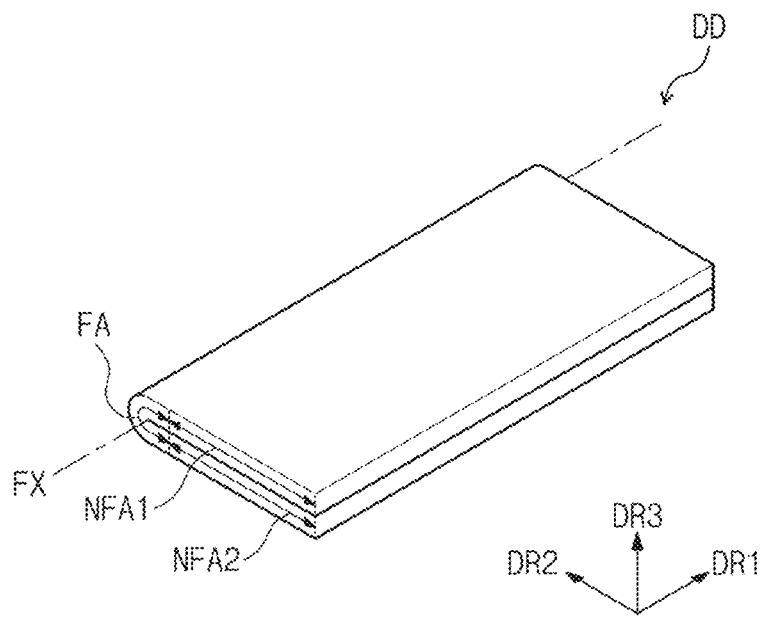
Figure 1C:
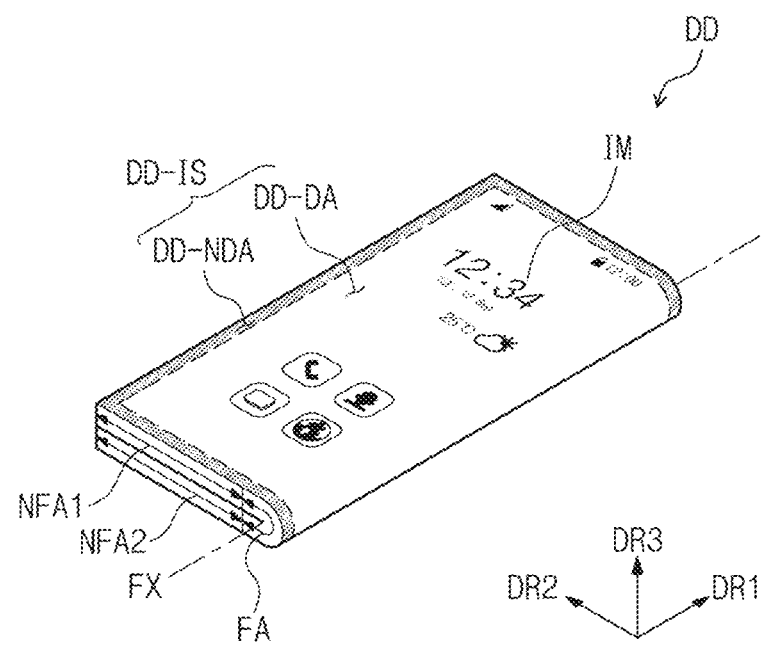

FIGS. 1A to 1C are perspective views of an embodiment of a display device DD according to the invention.

As illustrated in FIGS. 1A to 1C, a display surface DD-IS is parallel to a surface defined by a first directional axis DR1 and a second directional axis DR2. A normal direction of the display surface DD-IS, i.e., the thickness direction of the display device DD is indicated by a third directional axis DR3. The front surface (or top surface) and the rear surface (or bottom surface) of each member are divided by the third directional axis DR3. Hereinafter, the first to third directions may refer to the same reference numerals in the directions respectively indicated by the first to third directional axes DR1, DR2, and DR3.

As illustrated in FIGS. 1A to 1C, the display surface DD-IS includes a display area DD-DA on which an image IM is displayed and a non-display area DD-NDA adjacent to the display area DD-DA. The non-display area DD-NDA is an area on which the image is not displayed. As an example of the image IM, icon images are illustrated in FIGS. 1A to 1C. As an example, the display area DD-DA may have a quadrangular (e.g., rectangular) shape. The non-display area DD-NDA may surround the display area DD-DA. However, the invention is not limited thereto, and the shapes of the display area DD-DA and the non-display area DD-NDA may be modified.

As illustrated in FIGS. 1A to 1C, the display device DD may include a plurality of areas defined according to an operation type. The display device DD may include a folding area FA folded on the basis of a folding axis FX, a first non-folding area NFA1 adjacent to the folding area FA and a second non-folding area NFA2. The folding area FA is an area substantially forming a curvature.

In the illustrated embodiment, the display device DD in which the folding axis FX parallel to the long axis of the display device DD is defined is exemplarily illustrated. However, the invention is not limited thereto, and the folding axis FX may be parallel to the short axis of the display device DD. Moreover, in an embodiment of the invention, the display device DD may have an unfolded bar shape.

As illustrated in FIG. 1B, the display device DD may be inner-folded or inner-bended such that the display surface DD-IS of the first non-folding area NFA1 faces the display surface DD-IS of the second non-folding area NFA2. As illustrated in FIG. 1C, the display device DD may be outer-folded or outer-bended such that the display surface DD-IS is exposed externally. As illustrated in FIGS. 1A to 1C, a display module in which folding and unfolding are repeated may be defined as a foldable display module.

The display device DD in an embodiment of the invention may include a plurality of folding areas FA. In addition, the folding area FA may be defined to correspond to a type in which a user operates the display device DD. In an embodiment, the folding area FA may be defined in a diagonal direction in which the first directional axis DR1 crosses the second directional axis DR2 in a plan view, for example. The size of the folding area FA may not be fixed but be determined according to the radius of the curvature. The display device DD in the embodiment of the invention may be configured such that only an operation mode illustrated in FIGS. 1A and 1B is repeated, or only an operation mode illustrated in FIGS. 1A and 1C is repeated.

The display device DD applied to a mobile phone is illustrated in an embodiment of the invention, but the invention is not limited thereto. The display device DD in an embodiment of the invention may be applied to a large electronic device such as a television or a monitor, and a small or medium electronic device such as a tablet, a vehicle navigator, a game player, or a smart watch.

FIGS. 2A to 2D are cross-sectional views of an embodiment of the display device DD according to the invention. FIGS. 2A to 2D illustrate cross sections defined by the second directional axis DR2 and the third directional axis DR3. FIGS. 2A to 2D are simply illustrated so as to explain lamination relationships between functional panels and/or functional units forming the display device DD.

The display device DD in an embodiment of the invention may include a display panel, an input sensor, a reflection prevention unit and a window. In an embodiment of the invention, the input sensor may be omitted. At least some components among the display panel, the input sensor, the reflection prevention unit, and the window may be provided in a consecutive process, or at least some of the components may be combined with each other through an adhesion member. FIGS. 2A to 2D exemplarily illustrate a pressure sensitive adhesive film PSA as the adhesion member. The adhesion member to be described below may include a typical adhesive or gluing agent, and is not particularly limited.

In FIGS. 2A to 2D, among the input sensor, the reflection prevention unit, and the window, a component provided through a consecutive process with another component is represented as "a layer". Among the input sensor, the reflection prevention unit, and the window, a component combined with another component through an adhesive member is represented as "a panel". The panel includes a base layer for providing a base surface, for example, a synthetic resin film, a composite material film, a glass substrate, or the like, but the base layer may be omitted in "the layer". In other words, the member or unit represented as a "layer" is disposed on a base surface provided by another member or unit.

According to the presence or absence of the base layer, the input sensor and the reflection prevention unit may be referred to as an input sensing panel and a reflection prevention panel, or an input sensing layer and a reflection prevention layer. The window in the illustrated embodiment is illustrated to have a "panel" type applied thereto, but is not limited thereto.

Figure 2A:
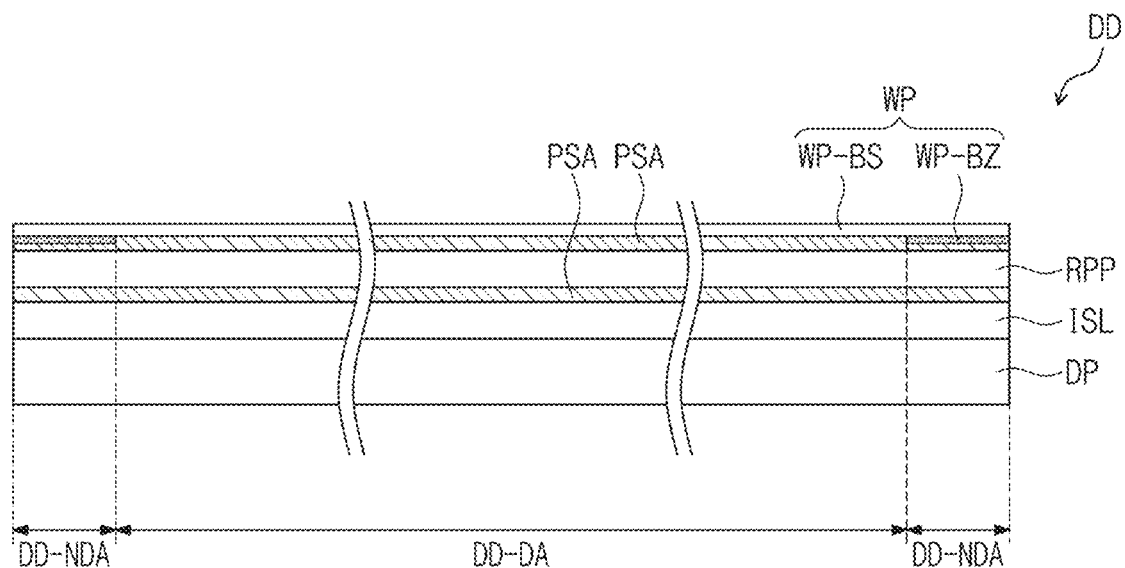
FIGS. 2A to 2D are cross-sectional views of an embodiment of a display device according to the invention.

As illustrated in FIG. 2A, the display device DD may include a display panel DP, an input sensing layer ISL, a reflection prevention panel RPP, and a window WP. In the display device DD, a combination structure of components except for the window WP may be defined as a display module.

The input sensing layer ISL may be directly disposed on the display panel DP. In the specification, "the configuration of B1 is directly disposed on the configuration of A1" means that an adhesive member is not disposed between the configuration A1 and the configuration of B1. The configuration of B1 is provided through a consecutive process on a base surface provided by the configuration A1 after the configuration of A1 is provided. The pressure sensitive adhesive films PSA are respectively disposed between the reflection prevention panel RPP and the window WP, and between the input sensing layer ISL and the reflection prevention panel RPP.

The display panel DP generates an image and the input sensing layer ISL acquires coordinate information on an external input (e.g., a touch event). Although not shown, a protection member may be further disposed under the display panel DP. The protection member supports the display panel DP and protects the display panel DP from an external shock.

The display panel DP in an embodiment of the invention may be a light emitting type display panel DP, but is not particularly limited thereto. In an embodiment, the display panel DP may be an organic light emitting display panel or a quantum dot light emitting display panel, for example. A light emitting layer of the organic light emitting display panel includes an organic light emitting material. A light emitting layer of the quantum dot light emitting display panel may include a quantum dot, a quantum rod, and/or the like. Hereinafter the display panel DP will be described as the organic light emitting display panel.

The reflection prevention panel RPP reduces a reflection ratio of natural light (or sunlight) input from above the window WP. The reflection prevention panel RPP in an embodiment of the invention includes a base layer and color filters. The color filters have a prescribed array. The array of the color filters may be determined in consideration of light emitting colors of pixels included in the display panel DP. The reflection prevention panel RPP may further include a black matrix adjacent to the color filters.

The window WM in an embodiment of the invention includes a base layer WP-BS and a light shield pattern WP-BZ. The base layer WP-BS may have a multilayer structure. The base layer WP-BS may include an organic substrate or a synthetic resin film.

Figure 2B:
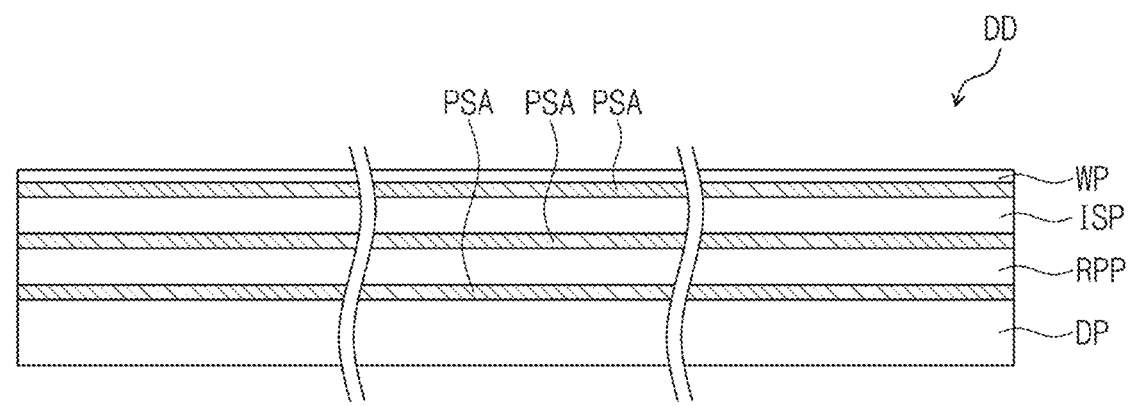
Figure 2C:
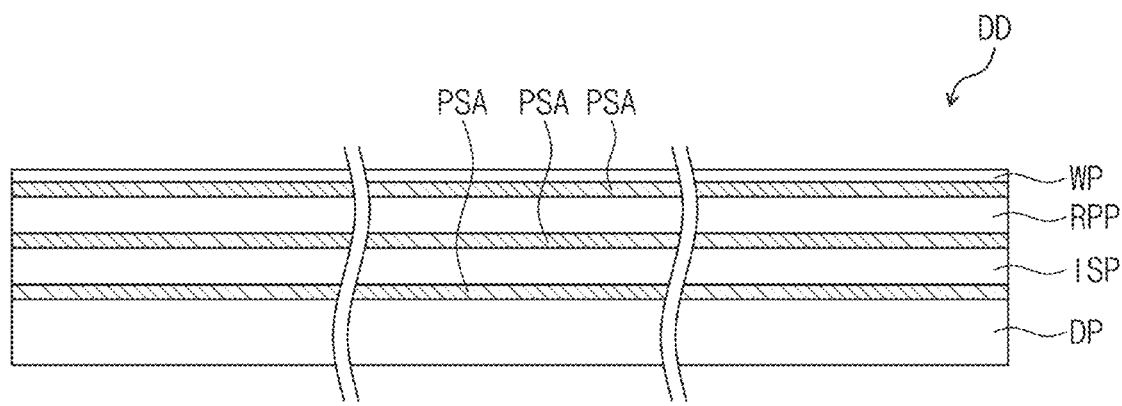
Figure 2C:
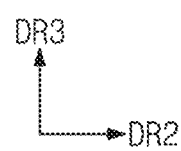
Figure 2D:
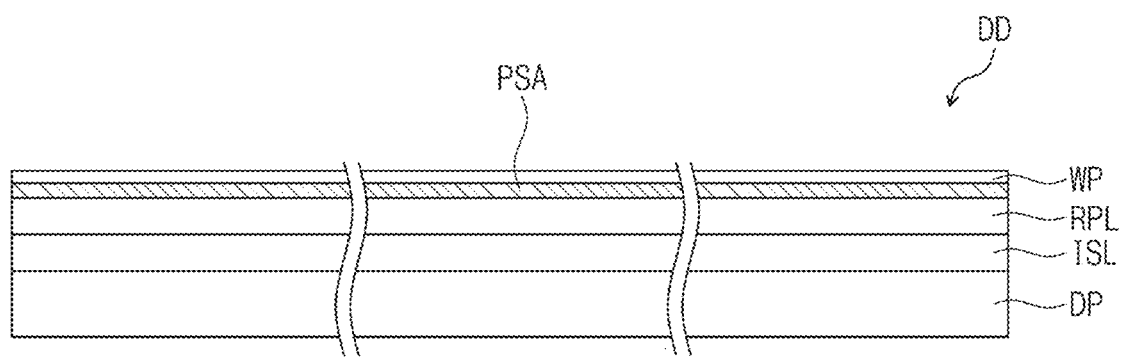
Figure 2D:
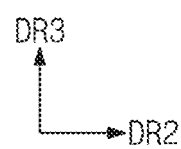

The light shield pattern WP-BZ partially overlaps the base layer WP-BS. The light shield pattern WP-BZ may be disposed on the rear surface of the base layer WP-BS to define a bezel area, i.e., the non-display area DD-NDA (refer to FIG. 1) of the display device DD. The light shield pattern WP-BZ may be provided with a colored organic film in, for example, a coating manner. In FIGS. 2B to 2D, the window WP is briefly illustrated without distinction of the base layer WP-BS and the light shield pattern WP-BZ.

In an embodiment of the invention, the light shield pattern WP-BZ may be omitted. In an embodiment of the invention, the light shield pattern WP-BZ may be disposed on the reflection prevention panel RPP. In an embodiment of the invention, the light shield pattern WP-BZ may be disposed on another optical member or another synthetic resin film to be disposed under the window WP.

As illustrated in FIGS. 2B and 2C, the display device DD may include a display panel DP, a reflection prevention panel RPP, an input sensing panel ISP, and a window WP. The lamination order of the input sensing panel ISL and the reflection prevention panel RPP may be changed.

As illustrated in FIG. 2D, the display device DD may include a display panel DP, an input sensing layer ISL, a reflection prevention layer RPL, and a window WP. Most of adhesive members are omitted from the display device DD, and the input sensing layer ISL and the reflection prevention layer RPL may be provided in a consecutive process on the base surface provided in the display panel DP. The lamination order of the input sensing layer ISL and the reflection prevention layer RPL may be changed.

In an embodiment of the invention, the reflection prevention layer RPL may include color filters. A detailed description about the reflection prevention layer RPL will be provided later.

Figure 3:
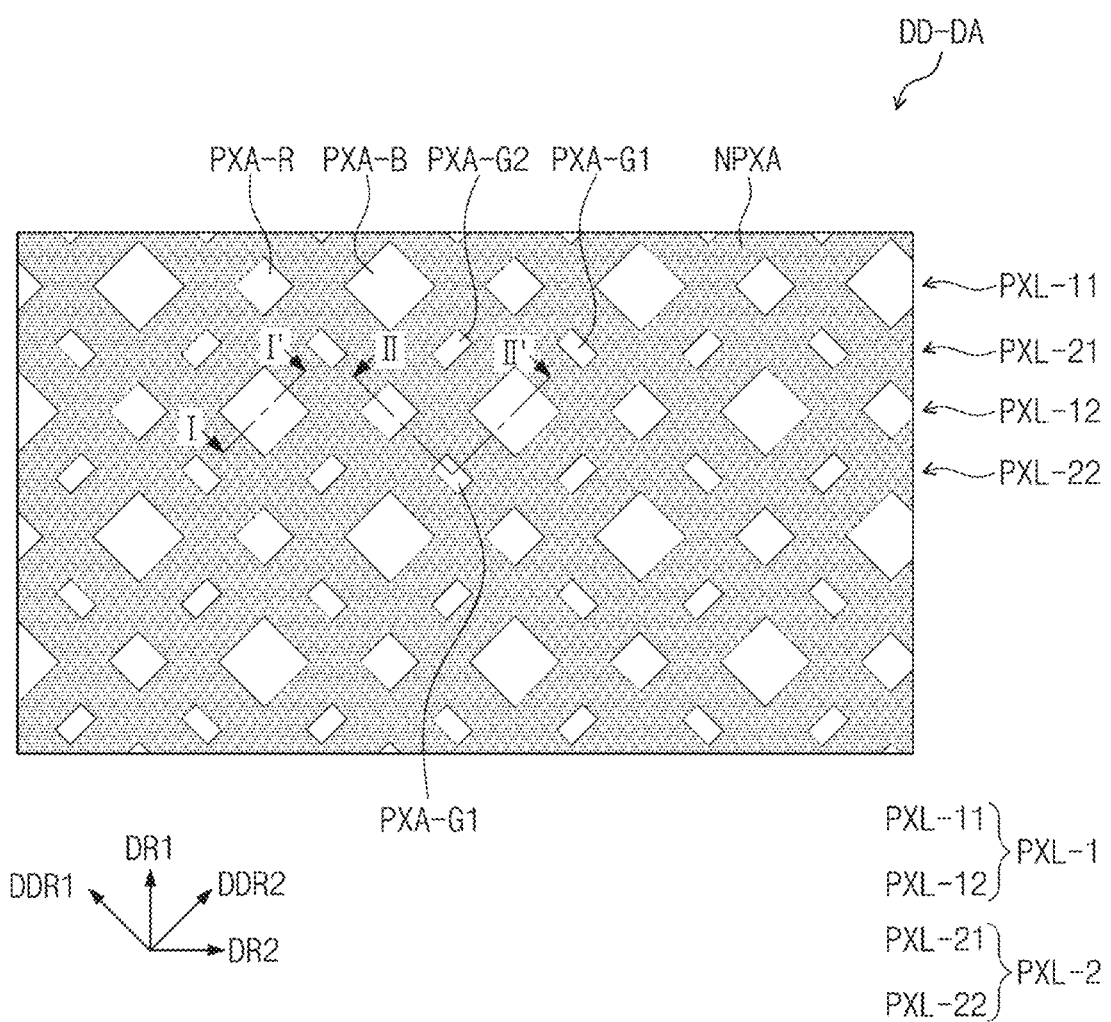
FIG. 3 is a plane view of an embodiment of a display area according to the invention.

FIG. 3 is a plane view of an embodiment of a display area DD-DA according to the invention.

With reference to FIG. 3, a plurality of light emitting areas PXA-R, PXA-G1, PXA-G2, and PXA-B is disposed in the display area DD-DA. A peripheral area NPXA is disposed adjacent to the plurality of light emitting areas PXA-R, PXA-G1, PXA-G2, and PXA-B. The peripheral area NPXA sets the boundaries between the plurality of light emitting areas PXA-R, PXA-G1, PXA-G2, and PXA-B, and prevents color mixing between the plurality of the light emitting areas. The plurality of light emitting areas PXA-R, PXA-G1, PXA-G2, and PXA-B may define a plurality of pixel rows PXL-1 and PXL-2 extending in the second direction DR2. In FIG. 3, the second direction DR2 is defined as the extension direction (or row direction) of the pixel rows PXL-1 and PXL-2, and the first direction DR1 is defined as a column direction.

In the illustrated embodiment, the plurality of pixel rows PXL-1 and PXL-2 are divided into two groups. The first group pixel row PXL-1 include a first light emitting area PXA-R (hereinafter, also referred to as a first color area) for emitting first color light, and a second light emitting area PXA-B (hereinafter, also referred to as a second color area) for emitting second color light. The first color area PXA-R is alternately disposed along the row direction DR2 with the second color area PXA-B. The first group pixel row PXL-1 may include a first pixel row PXL-11 and a second pixel row PXL-12. The first pixel row PXL-11 and the second pixel row PXL-12 may be alternately disposed along the column direction DR1.

The first pixel row PXL-11 and the second pixel row PXL-12 have a different disposition order of the first color area PXA-R and the second color area PXA-B. Within the column direction DR1, the first color area PXA-R of the first pixel row PXL-11 and the second color area PXA-B of the second pixel row PXL-12 may be arranged, and the second color area PXA-B of the first pixel row PXL-11 and the first color area PXA-R of the second pixel row PXL-12 may be arranged.

The second group pixel row PXL-2 may include third light emitting areas PXA-G1 and PXA-G2 (hereinafter, also referred to as third color areas) for emitting third color light. The third color areas PXA-G1 and PXA-G2 may be divided into two types of light emitting areas of which shapes are different in a plan view. When a first type area PXA-G1 is rotated by 90 degrees in a plan view, the first type area PXA-G1 may have the same shape as a second type area PXA-G2. The first type area PXA-G1 may have the shape extending in a first cross direction DDR1, and the second type area PXA-G2 may have a second cross direction DDR2 orthogonal to the first cross direction DDR1.

The first type area PXA-G1 may be alternately disposed along the row direction DR2 with the second type area PXA-G2. The second group pixel row PXL-2 may include a third pixel row PXL-21 and a fourth pixel row PXL-22. The third pixel row PXL-21 and the fourth pixel row PXL-22 may be alternately disposed along the column direction DR1.

The third pixel row PXL-21 and the fourth pixel row PXL-22 have a different disposition order of the first type area PXA-G1 and the second type area PXA-G2. Within the column direction DR1, the first type area PXA-G1 of the third pixel row PXL-21 may be arranged with the second type area PXA-G2 of the fourth pixel row PXL-22, and the second type area PXA-G2 of the third pixel row PXL-21 may be arranged with the first type area PXA-G1 of the fourth pixel row PXL-22. However, the invention is not limited thereto, and the second group pixel row PXL-2 may only include the first type light emitting areas having the same shape in a plan view.

The first group pixel row PXL-1 and the second group pixel row PXL-2 may be alternately disposed along the column direction DR1. Any one of the third pixel row PXL-21 and the fourth pixel row PXL-22 is disposed between the continuous first pixel row PXL-11 and second pixel row PXL-12, and the other of the third pixel row PXL-21 and the fourth pixel row PXL-22 is disposed between the second pixel row PXL-12 and another first pixel row PXL-11 consecutive to the second pixel row PXL-12.

In the illustrated embodiment, the first color area PXA-R, the second color area PXA-B, and the third color areas PXA-G1 and PXA-G2, the areas of which are different in a plan view, are exemplarily illustrated, but the invention is not limited thereto. Among the above-described light emitting areas, the size of the second color area PXA-B is illustrated to be the largest, and the size of the third color area PXA-G1 or PXA-G2 is illustrated to be the smallest, but this is only exemplary.

In the illustrated embodiment, the first color area PXA-R may emit red light, the second color area PXA-B may emit blue light, and the third color areas PXA-G1 and PXA-G2 may emit green light. However, the invention is not limited. The color light emitted from the first color area PXA-R, the second color area PXA-B, and the third color areas PXA-G1 and PXA-G2 may be selected as a combination of the three kinds of color light such that they may be mixed to emit white light.

As illustrated in FIG. 3, since a total number of the third color areas PXA-G1 and PXA-G2 is larger than (e.g., about double) each of a total number of the first color areas PXA-R and a total number of the second color areas PXA-B, reflection light reflected by the display area DD-DA may have prescribed characteristics. In particular, black reflection light may have a prescribed color sense in a state where the display DD (refer to FIG. 1) is in an OFF state. The reflection light is obtained from external light (e.g., the sunlight) reflected by the display area DD-DA.

Even when a reflection ratio is lowered by the reflection prevention units RPP and RPL described with reference to FIGS. 2A to 2D, the color sense of the reflection light may have prescribed characteristics. According to illustrated embodiment, even when the light emitting areas PXA-R, PXA-G1, PXA-G2, and PXA-B have the disposition described with reference to FIG. 3, the color sense of the reflection light may be close to the pure black. The display device in the illustrated embodiment may have a small color shift amount of the reflection light in comparison to a comparative example including a polarizing plate as the reflection prevention unit. Hereinafter, a description thereabout will be provided in detail with reference to the relationships between the light emitting areas PXA-R, PXA-G1, PXA-G2, and PXA-B, and the reflection prevention units RPP and RPL.

Figure 4:
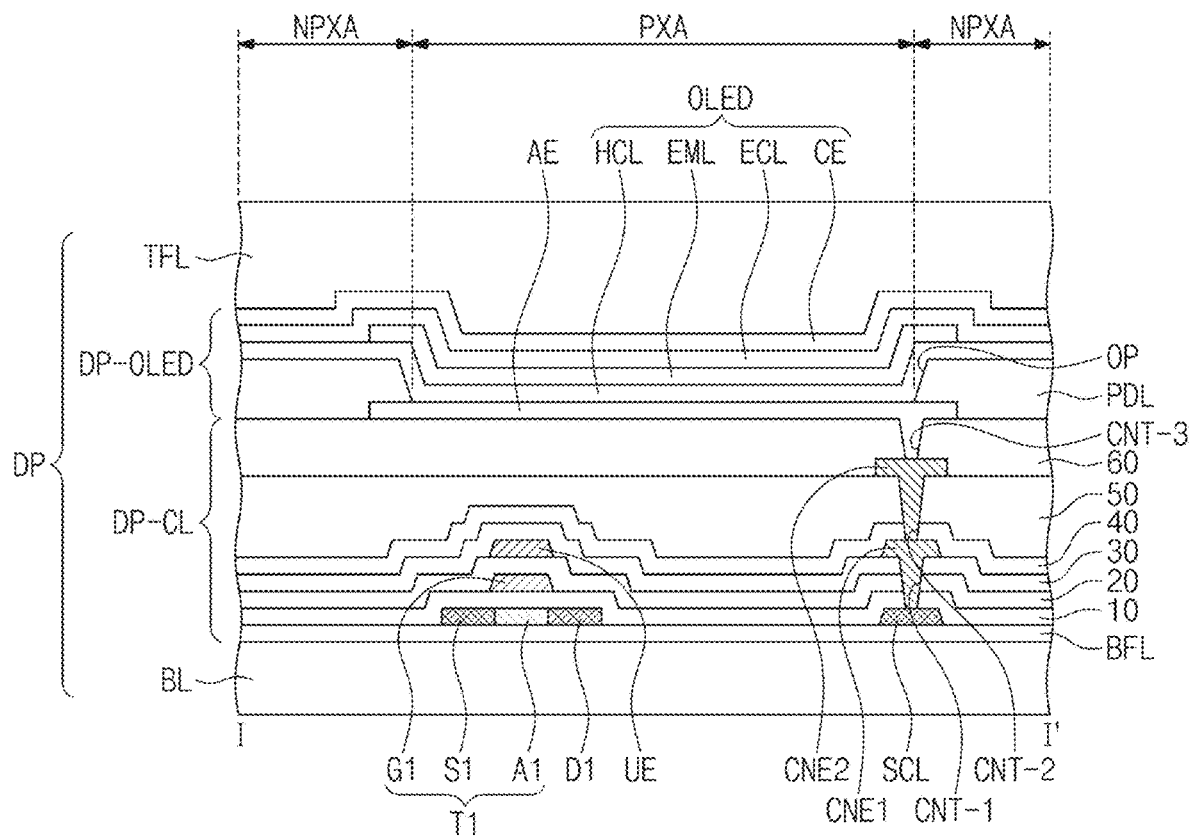
FIG. 4 is a cross-sectional view taken along line I-I' of FIG. 3.

FIG. 4 is a cross-sectional view taken along line I-I' of FIG. 3. FIG. 4 specifically illustrates the display panel DP described with reference to FIGS. 2A to 2D.

The display panel DP may include a base layer BL, a circuit element layer DP-CL, a display element layer DP-OLED, and an upper insulation layer. A lamination structure of the display panel DP is not particularly limited.

With reference to FIG. 4, the display panel DP may include a plurality of insulation layers, a semiconductor pattern, a conductive pattern, a signal line, and the like. The insulation layers, the semiconductor layer, and the conductive layer may be provided through processes of coating, deposition, and the like. Then, the insulation layers, the semiconductor layer, and the conductive layer may be selectively patterned through a photolithography process. Through such processes, semiconductor patterns, conductive patterns, signal lines, and the like are provided which are included in the circuit element layer DP-CL and the display element layer DP-OLED.

The base layer BL may include a synthetic resin film. In an embodiment, the base layer BL may include a glass substrate, a metal substrate, or an organic/inorganic composite material substrate, etc.

At least one inorganic layer is disposed on the top surface of the base layer BL. The buffer layer BFL may enhance the bonding force between the base layer BL and the semiconductor pattern. The buffer layer BFL may include a silicon oxide layer and a silicon nitride layer. The silicon oxide layer and the silicon nitride layer may be alternately laminated.

The semiconductor pattern may be disposed on the buffer layer BFL. The semiconductor pattern may include polysilicon. However, the invention is not limited thereto, and the semiconductor pattern may include amorphous silicon or metal oxides.

FIG. 4 only illustrates a portion of the semiconductor pattern, and the semiconductor pattern may be further disposed in the plurality of light emitting areas PXA-R, PXA-G1, PXA-G2, and PXA-B (refer to FIG. 3) in a plan view. The semiconductor pattern may be arranged according to a specific rule across the plurality of light emitting areas PXA-R, PXA-G1, PXA-G2, and PXA-B. The semiconductor pattern has different property according to whether to be doped or not. The semiconductor pattern may include a doped area and a non-doped area. The doped area may be doped with an N-type dopant or a P-type dopant. A P-type transistor includes a doped area doped with a P-type dopant.

The doped area has larger conductivity than that of the non-doped area, and substantially has a role of an electrode or a signal line. The non-doped area substantially corresponds to an active area (or a channel) of a transistor. In other words, a portion of the semiconductor pattern may be the active area of the transistor, another portion may be a source or a drain, and another portion may be a connection electrode or a connection signal.

As illustrated in FIG. 4, the source S1, the active area A1, and the drain D1 of the transistor T1 are provided from the semiconductor pattern. FIG. 4 illustrates a portion of the signal connection line SCL provided from the semiconductor pattern. Although not illustrated separately, the signal connection line SCL may be connected to the drain D1 of the transistor T1 in a plan view.

A first insulation layer 10 to a sixth insulation layer 60 are disposed on the buffer layer BFL. The first insulation layer 10 to the sixth insulation layer 60 may be inorganic layers or organic layers. A gate G1 is disposed on the first insulation layer 10. An upper electrode UE may be disposed on the second insulation layer 20. A first connection electrode CNE1 may be disposed on the third insulation layer 30. The first connection electrode CNE1 may be connected to a signal connection line SCL through a contact hole CNT-1 penetrating through the first to third insulation layers 10 to 30. A second connection electrode CNE2 may be disposed on the fifth insulation layer 50. The second connection electrode CNE2 may be connected to the first connection electrode CNE1 through a contact hole CNT-2 penetrating through the fourth insulation layer 40 and the fifth insulation layer 50.

A light emission element OLED is disposed on the sixth insulation layer 60. A first electrode AE is disposed on the sixth insulation layer 60. The first electrode AE is connected to the second output electrode CNE2 through a contact hole CNT-3 penetrating the sixth insulation layer 60. An opening OP (hereinafter, also referred to as a light emitting opening) is defined in a pixel definition layer PDL. The light emitting opening OP exposes at least a portion of the first electrode AE.

In an embodiment of the invention, the pixel definition layer PDL may have a black color. The pixel definition layer PDL may include a black coloring agent. The pixel definition layer PDL may include a black dye mixed with a base resin, or a black pigment.

FIG. 4 illustrates the light emitting area PXA and peripheral area NPXA (or a non-light emitting area) adjacent to the light emitting area PXA. The light emitting area PXA may be defined to substantially correspond to some area of the first electrode AE exposed by the light emission opening OP.

A hole control layer HCL may be commonly disposed in the light emitting area PXA and the non-light emitting area NPXA. The hole control layer HCL may include a hole transport layer, and further include a hole injection layer. A light emission layer EML is disposed on the hole control layer HCL. The light emission layer EML may be disposed on an area corresponding to the light emission opening part OP. In other words, the light emission layer EML may be separately provided in each of the light emitting areas PXA-R, PXA-G1, PXA-G2, and PXA-B.

An electron control layer ECL is disposed on the light emission layer EML. An electron control layer ECL may include a hole transport layer, and further include a hole injection layer. A second electrode CE is disposed on the electron control layer ECL.

The upper insulation layer TFL is disposed on the second electrode CE. The upper insulation layer TFL may include a plurality of thin films. As in the illustrated embodiment, the upper insulation layer TFL may include a capping layer and a thin film encapsulation layer.

Figure 5:
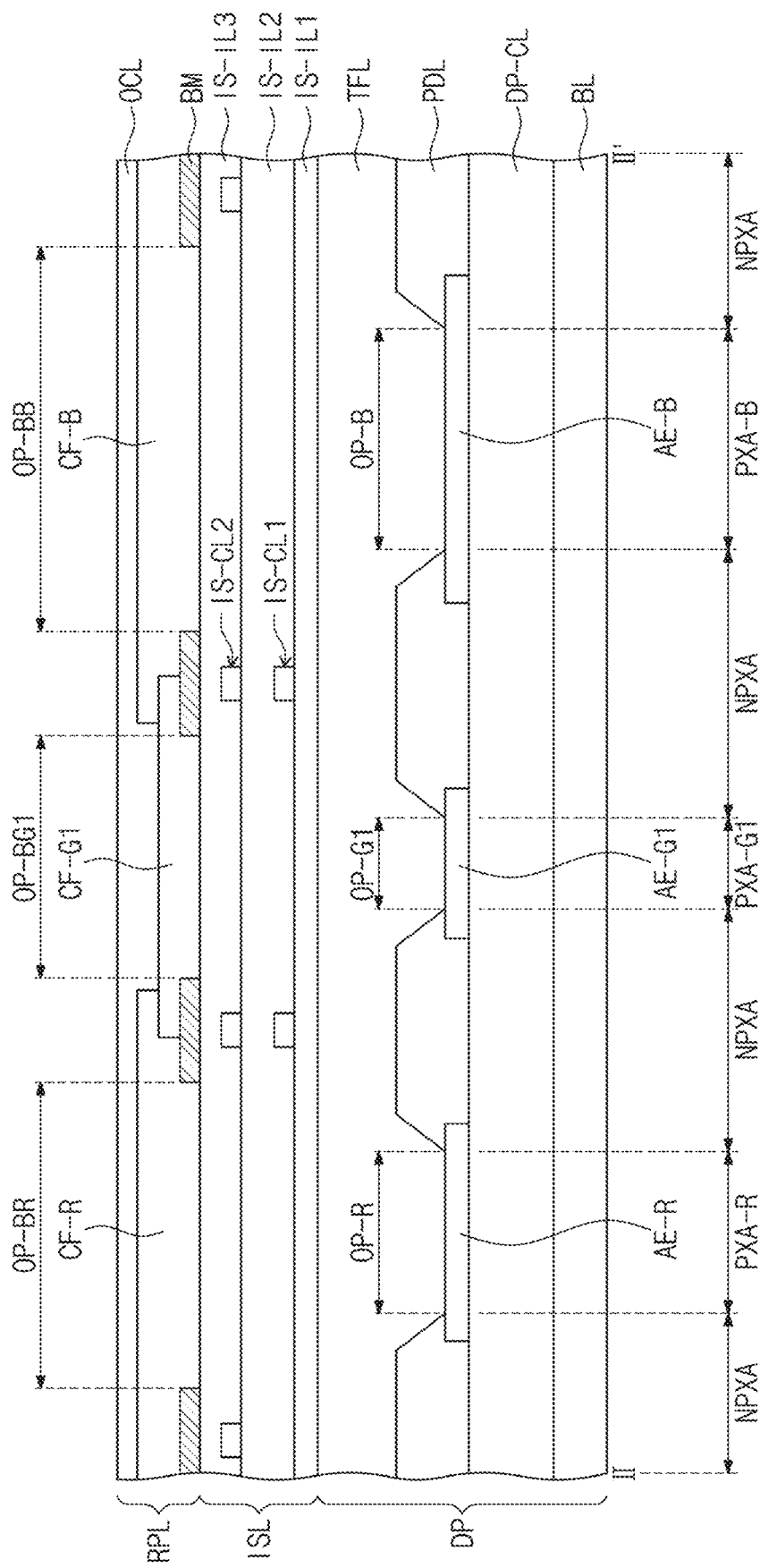
FIG. 5 is a cross-sectional view taken along line II-II' of FIG. 3.

FIG. 5 is a cross-sectional view taken along line II-II' of FIG. 3. FIG. 5 briefly illustrates the display panel DP on the basis of three light emitting areas PXA-R, PXA-G1, and PXA-B. In addition, FIG. 5 is an enlarged view on the basis of FIG. 2D.

First electrodes AE-R, AE-B, and AE-G1, which correspond to a first color area PXA-R, a second color area PXA-B, and a third color area PXA-G1, are disposed on the circuit element layer DP-CL. Light emission openings OP-R, OP-B, and OP-G1, which correspond to the first color area PXA-R, the second color area PXA-B, and the third color area PXA-G1, are defined in the pixel definition layer PDL. In FIG. 5, some components of the light emission element OLED (refer to FIG. 4) are not illustrated.

With reference to FIG. 5, the input sensing layer ISL may be directly disposed on the upper insulation layer TFL. The input sensing layer ISL may include a first insulation layer IS-ILL a first conductive layer IS-CL1, a second insulation layer IS-IL2, a second conductive layer IS-CL2, and a third insulation layer IS-IL3. In an embodiment of the invention, the first insulation layer IS-IL1 and/or the third insulation layer IS-IL3 may be omitted.

Each of the first conductive layer IS-CL1 and the second conductive layer IS-CL2 may have a single layer structure or a multilayer structure laminated along the third directional axis DR3. A conductive layer of the multilayer structure may include at least two among transparent conductive layers and metal layers. The conductive layer of the multilayer structure may include metal layers including different metals. In an embodiment, the transparent conductive layer may include indium tin oxide ("ITO"), indium zinc oxide ("IZO"), zinc oxide (ZnO), indium tin zinc oxide ("ITZO"), poly(3,4-ethylenedioxythiophene) ("PEDOT"), a metal nanowire, or graphene, for example. In an embodiment, the metal layer may include molybdenum, silver, titanium, copper, aluminum, and an alloy thereof, for example. In an embodiment, each of the first conductive layer IS-CL1 and the second conductive layer IS-CL2 may have a three-layer metal structure, for example, a three-layer structure of titanium/aluminum/titanium, for example. A metal having relatively high durability and a low reflection ratio may be applied to the top/bottom layers, and a metal having high electric conductivity may be applied to the in-between layer.

Each of the first conductive layer IS-CL1 and the second conductive layer IS-CL2 includes a plurality of conductive patterns. Hereinafter, the first conductive layer IS-CL1 is described to include first conductive patterns and the second conductive layer IS-CL2 is described to include second conductive patterns. The first conductive patterns and the second conductive patterns may respectively include sensing electrodes and signal lines connected thereto. The first conductive patterns and the second conductive patterns may be disposed to overlap the partition pattern BM to be described later. The partition pattern BM prevents the external light from being reflected by the first conductive patterns and the second conductive patterns.

Each of the first insulation layer IS-IL1 to the third insulation layer IS-IL3 may include an inorganic film or an organic film. In an embodiment of the invention, the first insulation layer IS-IL1 and the second insulation layer IS-IL2 may include inorganic films. The third insulation layer IS-IL3 may include an organic film.

With reference to FIG. 5, the reflection prevention layer RPL may be directly disposed on the input sensing layer ISL. The reflection prevention layer RPL may include the partition pattern BM, a first color filter CF-R, a second color filter CF-B, and a third color filter CF-G1.

The partition pattern BM overlaps the peripheral area NPXA. The partition pattern BM may include a light shield pattern having a black color. In an embodiment of the invention, the partition pattern BM may include a black coloring agent, for example. In an embodiment, the black coloring agent may include a black dye or a black pigment, for example. In an embodiment, the black coloring agent may include a metal such as chromium, or an oxide thereof.

Openings OP-BR, OP-BB, and OP-BG1, which correspond to the openings OP-R, OP-B, and OP-G1, are defined in the partition pattern BM. The opening size of the openings OP-BR, OP-BB, and OP-BG1 of the partition pattern BM is larger than that of the openings OP-R, OP-B, and OP-G1 of the pixel definition layer PDL.

The first color filter CF-R, the second color filter CF-B, and the third color filter CF-G1 respectively correspond to a first color area PXA-R, a second color area PXA-B, and a third color area PXA-G1. The first color filter CF-R passes first color light, i.e., red light, the second color filter CF-B passes second color light, i.e., blue light, and the third color filter CF-G1 passes third color light, i.e., green light.

The first color filter CF-R, the second color filter CF-B, and the third color filter CF-G1 may lower a reflection ratio of the external light. Since each of the first to third color filters transmits light in a specific wavelength range, and absorbs light other than the wavelength range, the external light are mostly absorbed and only a portion thereof is reflected.

The first color filter CF-R, the second color filter CF-B, and the third color filter CF-G1 may include a base resin, and a dye and/or a pigment dispersed in the base resin. The base resin is a material in which the dye and/or the pigment is dispersed, and may be composed of various resin compositions that are typically referred to as a binder.

The reflection prevention layer RPL may include a protection layer OCL for covering the first color filter CF-R, the second color filter CF-B, and the third color filter CF-G1. The protection layer OCL may include an organic layer and provide a flat surface. In an embodiment of the invention, the protection layer OCL may be omitted.

Each of a portion of the first color filter CF-R, a portion of the second color filter CF-B, and a portion of the third color filter CF-G1, which are disposed in the peripheral area NPXA, is disposed on the partition pattern BM. In the embodiment, the partition pattern BM is illustrated to be disposed lower than the first color filter CF-R, the second color filter CF-B, and the third color filter CF-G1, but the invention is not limited thereto. In an embodiment, the partition pattern BM may be disposed upper than at least any one among the first color filter CF-R, the second color filter CF-B, and the third color filter CF-G1.

At least any one between the first color filter CF-R and the second color filter CF-B is disposed on the third color filter CF-G1. As illustrated in FIG. 5, a portion of the first color filter CF-R is disposed on the third color filter CF-G1 in an area in which the partition pattern BM is disposed. The second color filter CF-B may also be disposed on the third color filter CF-G1 to cover a portion of the third color filter CF-G1. An exposed area of the third color filter CF-G1 may be adjusted by means of the first color filter CF-R and the second color filter CF-B to adjust the color sense of the reflection light. The description thereabout will be described below.

FIGS. 6A to 6E are plan views illustrating an embodiment of a fabrication process of a reflection prevention unit according to the invention. FIGS. 6A to 6E illustrate an enlarged portion of FIG. 3. The manufacturing process will be described in detail on the basis of the six light emitting areas PXA-R1, PXA-R2, PXA-B1, PXA-B2, PXA-G1, and PXA-G2 of the first pixel row PXL-11, the second pixel row PXL-12, and the third pixel row PXL-2 disposed therebetween.

Figure 6A:
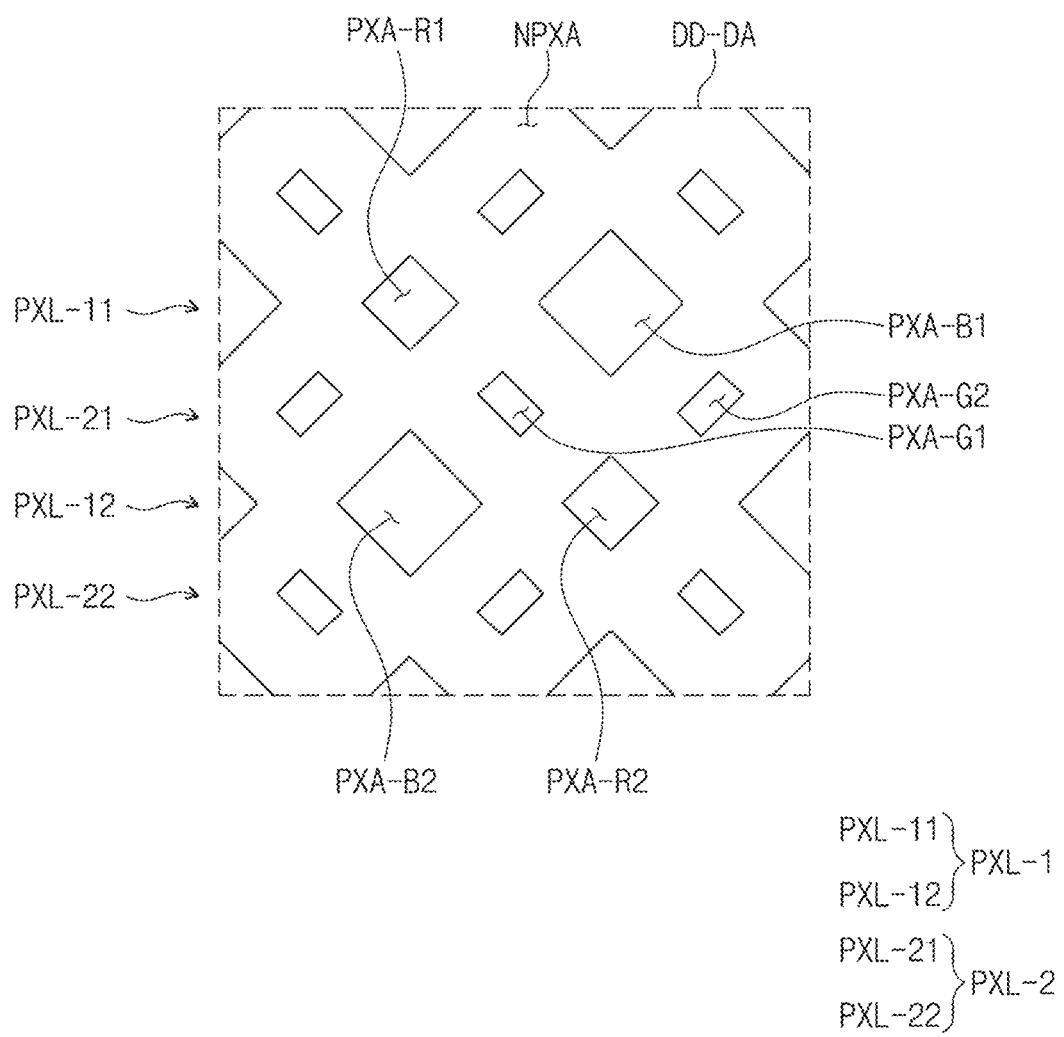
FIGS. 6A to 6E are drawings illustrating an embodiment of a fabrication process of a reflection prevention unit according to the invention.

With reference to FIG. 6A, illustrated are the first light emitting area PXA-R1 and the fourth light emitting area PXA-R2 for emitting red light, the second light emitting area PXA-B1 and the third light emitting area PXA-B2 for emitting blue light, and the fifth light emitting area PXA-G1 and the sixth light emitting area PXA-G2 for emitting green light. The fifth light emitting area PXA-G1 is disposed inside an area defined by the first light emitting area PXA-R1, the second light emitting area PXA-B1 and the third light emitting area PXA-B2, and the fourth light emitting area PXA-R2.

The first light emitting area PXA-R1 and the second light emitting area PXA-B1 are included in the first pixel row PXL-11, and the third light emitting area PXA-B2 and the fourth light emitting area PXA-R2 are included in the second pixel row PXL-12. The fifth light emitting area PXA-G1 and the sixth light emitting area PXA-G2 are included in the third pixel row PXL-21.

Figure 6B:
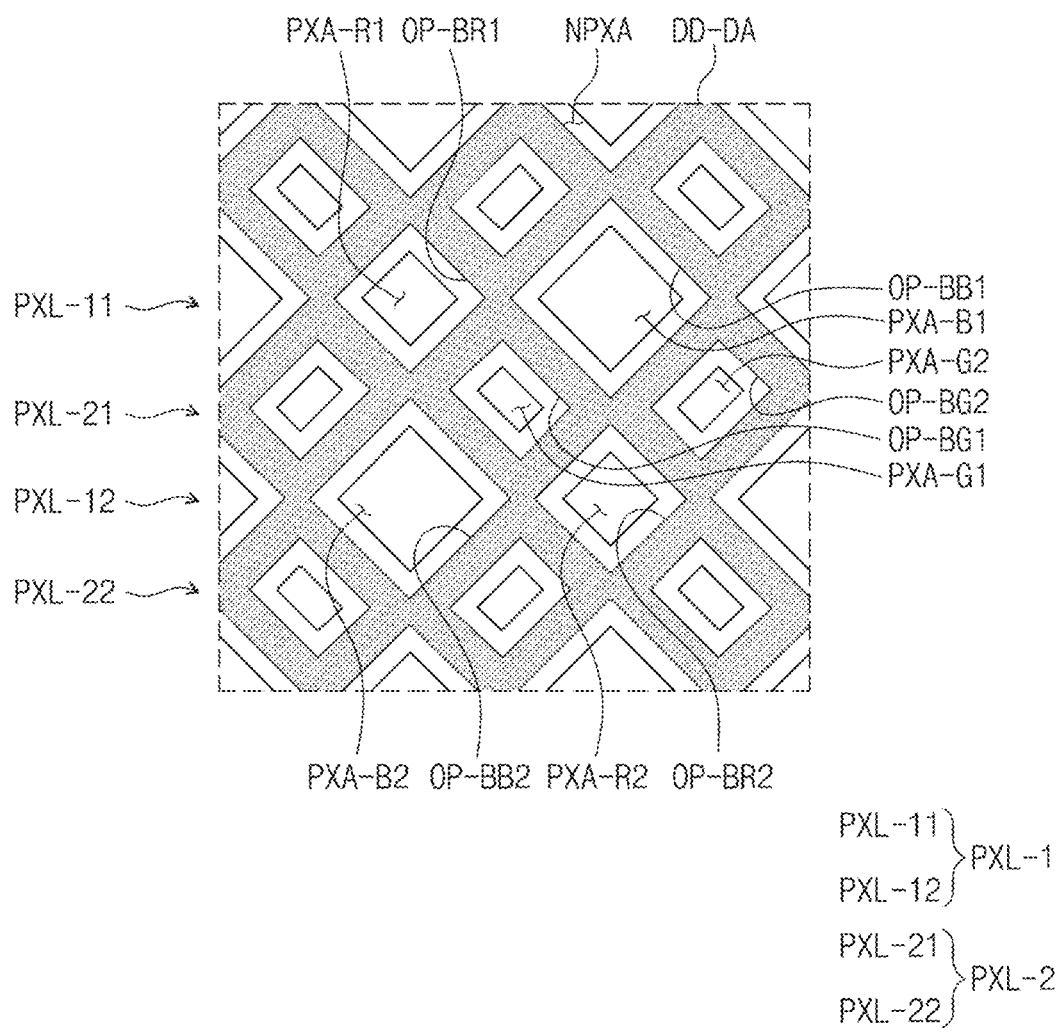

As illustrated in FIG. 6B, the partition pattern BM is provided. The partition pattern BM may be directly disposed on the input sensing layer ISL illustrated in FIG. 5. A resin layer including a base resin and a black coloring agent is provided, and then the first to sixth openings OP-BR1, OP-BR2, OP-BB1, OP-BB2, OP-BG1, and OP-BG2 may be defined in the resin layer though a photolithography process.

Figure 6C:
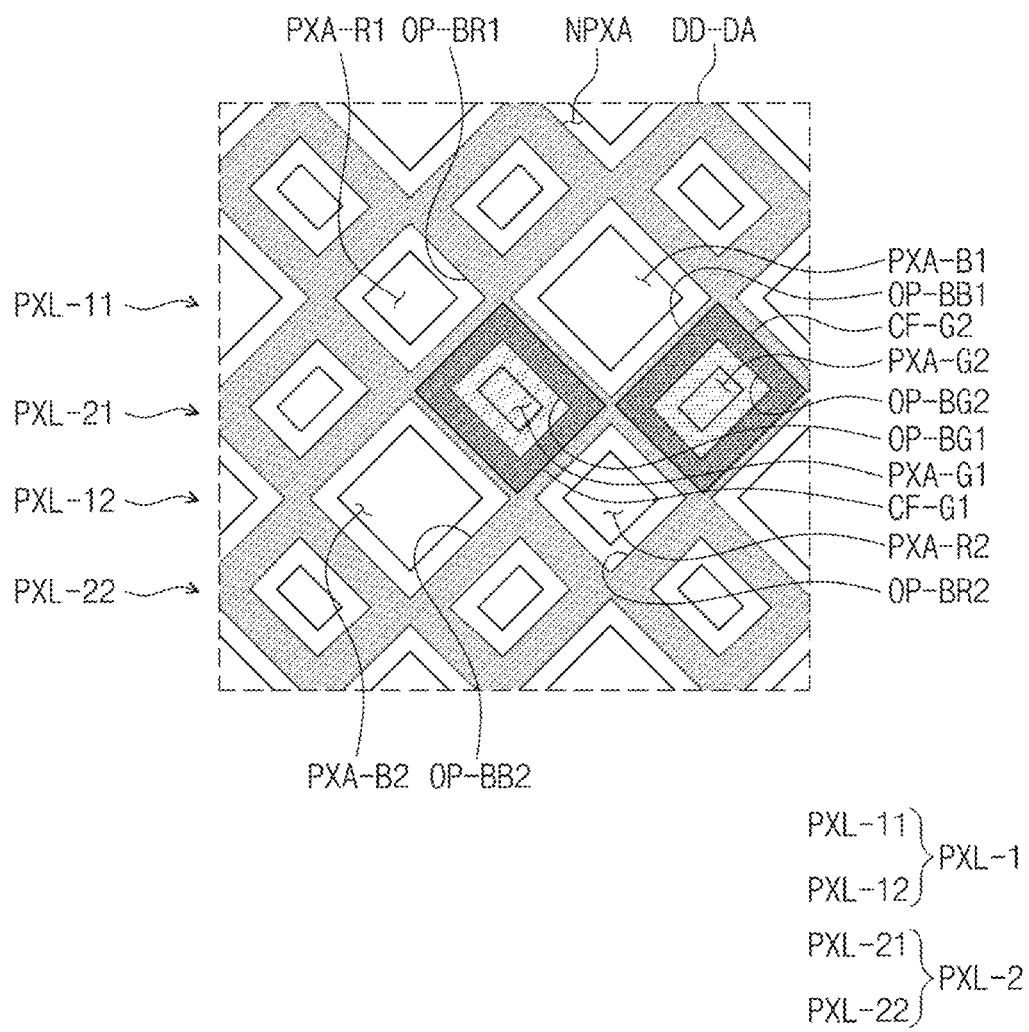

As illustrated in FIG. 6C, the third color filters CF-G1 and CF-G2 which correspond to the fifth and sixth light emitting areas PXA-G1 and PXA-G2 are provided. The third color filter CF-G1 corresponding to the fifth light emitting area PXA-G1 may be separated from the third color filter CF-G2 corresponding to the sixth light emitting area PXA-G2.

After the color filter layer is disposed on the input sensing layer ISL illustrated in FIG. 5, the color filter layer is patterned through a photolithography process. In an embodiment of the invention, the third color filter CF-G1 corresponding to the fifth light emitting area PXA-G1 and the third color filter CF-G2 corresponding to the sixth light emitting area PXA-G2 may also be patterned so as to have an integrated shape.

Hereinafter, a description will be provided about the third color filter CF-G1 corresponding to the fifth light emitting area PXA-G1. The edges of the third color filter CF-G1 may overlap the partition pattern BM.

Figure 6D:
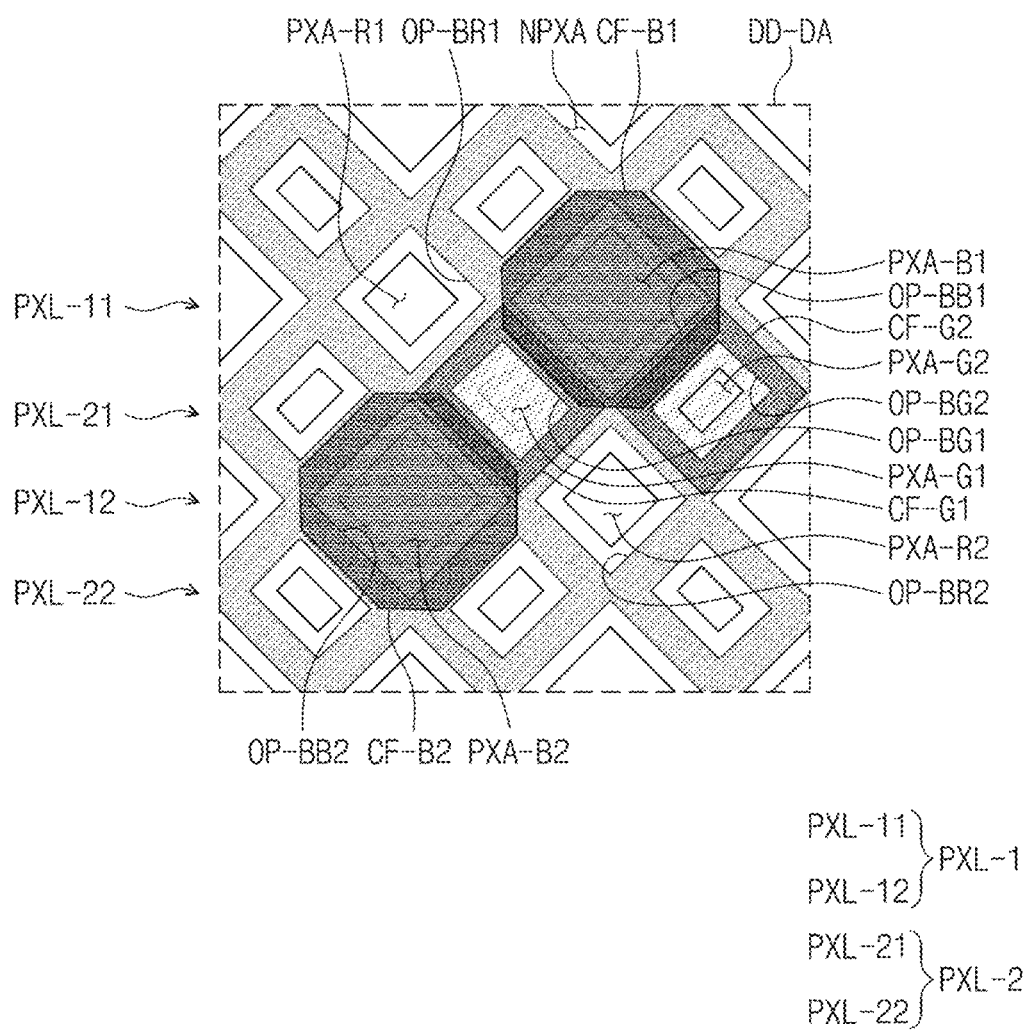

As illustrated in FIG. 6D, the second color filters CF-B1 and CF-B2 which correspond to the second light emitting area PXA-B1 and the third light emitting area PXA-B2 are provided. The color filter layer is disposed on the input sensing layer ISL illustrated in FIG. 5, and then the color filter layer is patterned through a photolithography process. FIG. 6D illustrates a pattern CF-B1 (or a color filter pattern) corresponding to the second light emitting area PXA-B1 of the second color filters CF-B1 and CF-B2, and a pattern CF-B2 corresponding to the third light emitting area PXA-B2.

A portion of the second color filters CF-B1 and CF-B2, which overlaps the partition pattern BM, is disposed on the third color filter CF-G1. However, the portion of the second color filters CF-B1 and CF-B2, which overlaps the partition pattern BM, is not limited to be entirely disposed on the third color filter CF-G1. It is sufficient that the portion of the second color filters CF-B1 and CF-B2, which overlaps the partition pattern BM, is partially disposed on the third color filter CF-G1.

In an embodiment, the second color filters CF-B1 and CF-B2 are not divided into a plurality of patterns, but may have an integrated shape. Although not shown separately, the color filters corresponding to the light emitting areas for emitting the blue light may be provided through a single process.

Figure 6E:
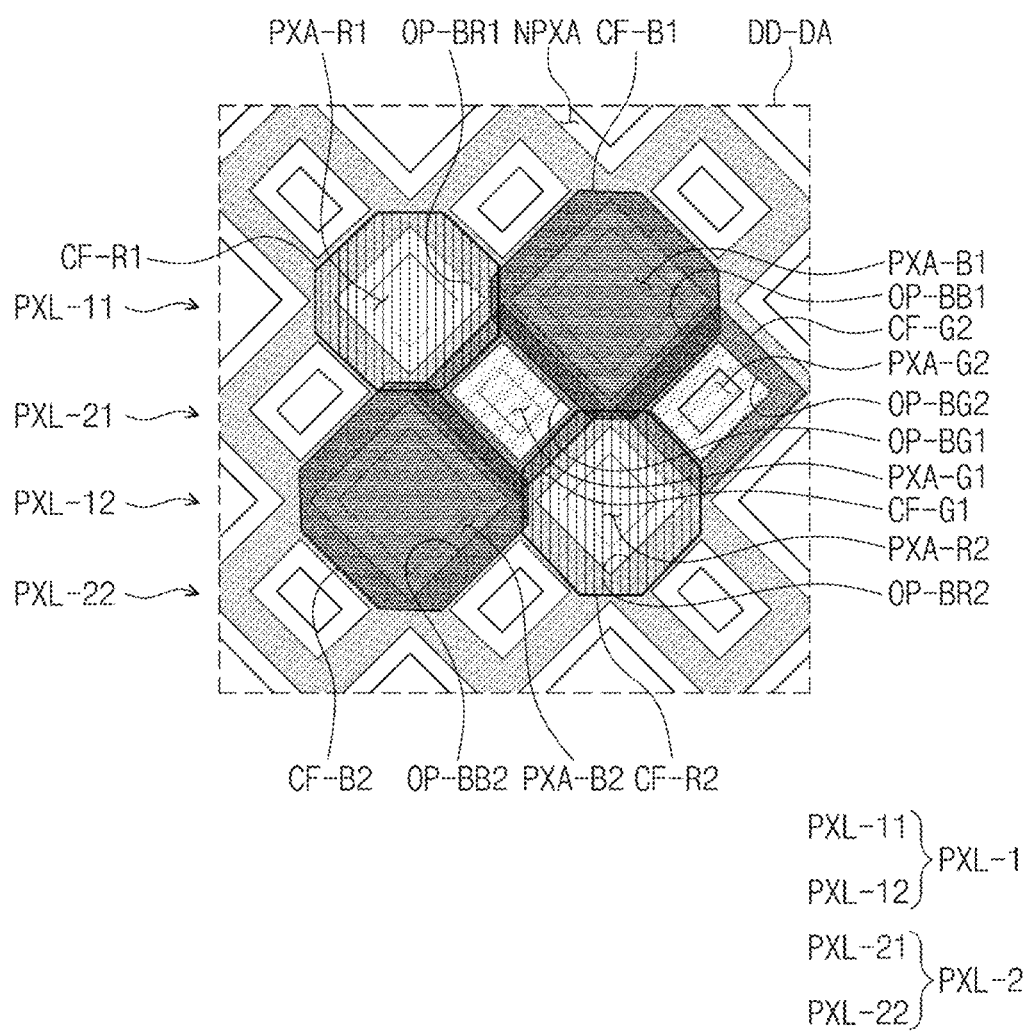

As illustrated in FIG. 6E, the first color filters CF-R1 and CF-R2 which correspond to the first light emitting area PXA-R1 and the fourth light emitting area PXA-R2 are provided. A portion of the first color filters CF-R1 and CF-R2, which overlaps the partition pattern BM, is disposed on the third color filter CF-G1. However, the portion of the first color filters CF-R1 and CF-R2, which overlaps the partition pattern BM, is not limited to be entirely disposed on the third color filter CF-G1. It is sufficient that the portion of the first color filters CF-R1 and CF-R2, which overlaps the partition pattern BM, is partially disposed on the third color filter CF-G1.

In an embodiment, the first color filters CF-R1 and CF-R2 are not divided into a plurality of patterns, but may have an integrated shape. Although not shown separately, the color filters corresponding to the light emitting areas for emitting the red light may be provided through a single process. In the above description, the second color filters CF-B1 and CF-B2 are provided and then the first color filters CF-R1 and CF-R2 are provided, but the formation order is not limited thereto.

With reference to FIG. 6E, the first color filters CF-R1 and CF-R2 and the second color filters CF-B1 and CF-B2 cover a portion of the third color filter CF-G1 in the peripheral area NPXA. Accordingly, in a plan view, the size of the third color filter CF-G1 exposed externally is reduced.

As described with reference to FIG. 3, since a total number of the third color areas PXA-G1 and PXA-G2 is larger than each of a total number of the first color areas PXA-R and a total number of the second color areas PXA-B, the number of patterns of the third color filters CF-G1 and CF-G2 is larger than the number of patterns of the first color filters CF-R1 and CF-R2 and the number of patterns of the second color filters CF-B1 and CF-B2. When comparing occupation areas, the size of the third color filters CF-G1 and CF-G2 is larger than the size of the first color filters CF-R1 and CF-R2 and the size of the second color filters CF-B1 and CF-B2.

However, as described above, in a plan view, differences in the externally exposed size of the first color filters CF-R1 and CF-R2, the size of the second color filters CF-B1 and CF-B2, and the size of the third color filters CF-G1 and CF-G2 may be decreased by reducing the externally exposed size of the third color filter CF-G1. Consequently, the reflection color sense of black may be prevented from being shifted to a specific color.

Figure 7A:
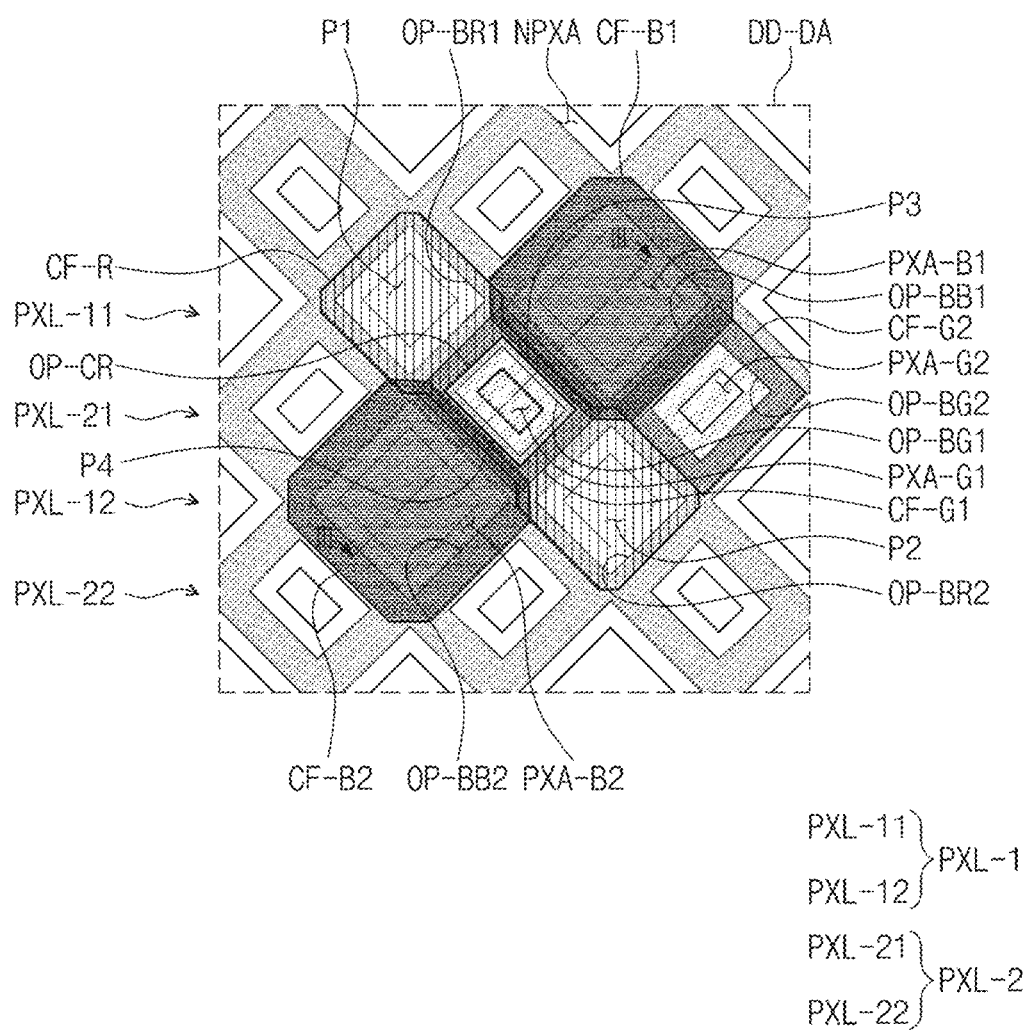
FIGS. 7A and 7B are plan views of an embodiment of a display area according to the invention.
Figure 7B:
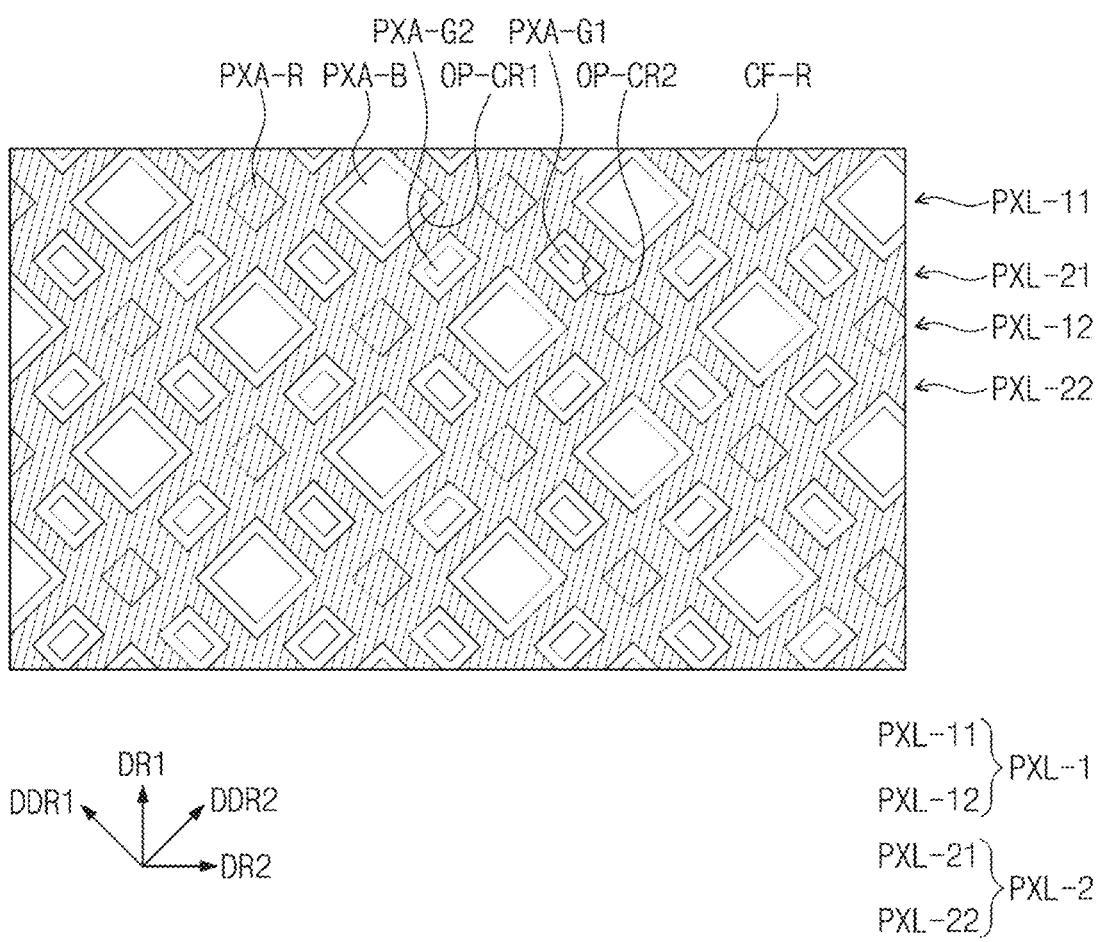
Figure 7C:
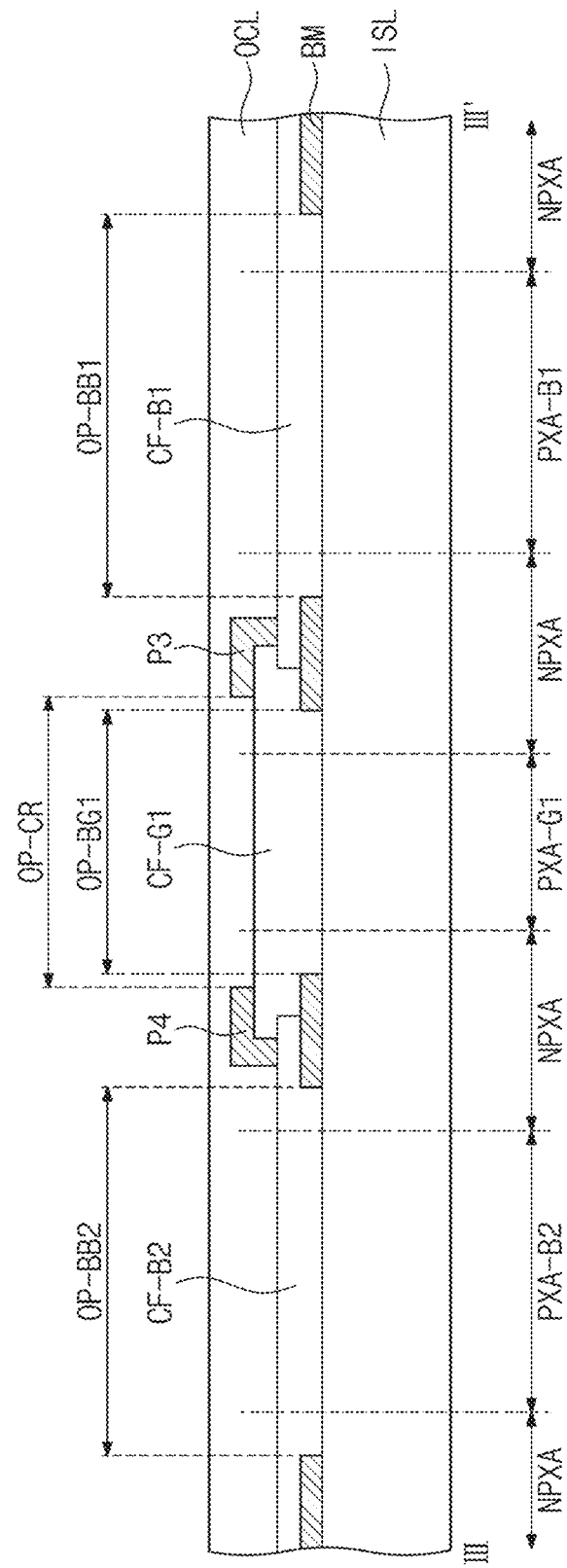
Figure 8:
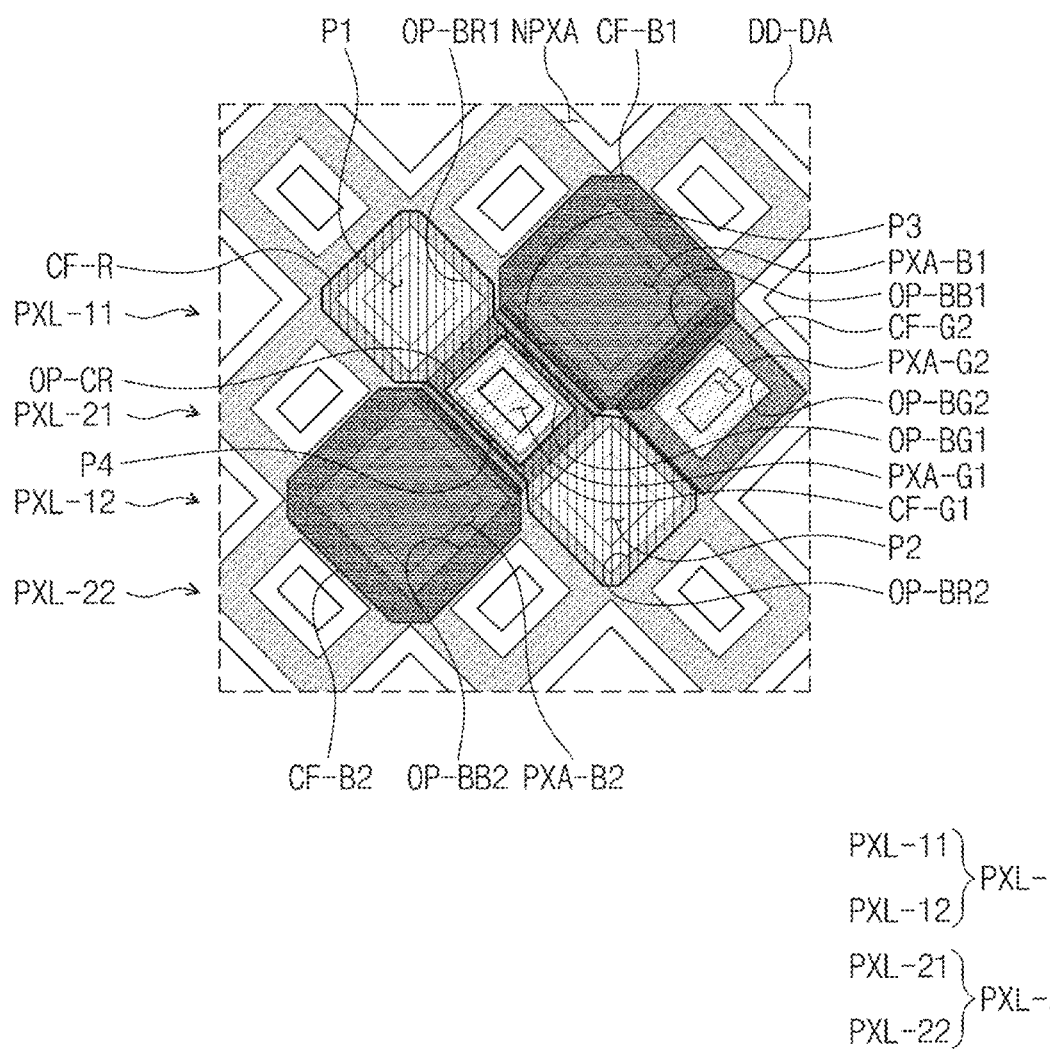
FIG. 8 is a plane view of an embodiment of a display area according to the invention.

FIGS. 7A and 7B are plan views of an embodiment of the display area DP-DA according to the invention. FIGS. 7C and 7D are plan views taken along line of FIG. 7A. FIG. 8 is a plane view of an embodiment of the display area DD-DA according to the invention. FIG. 7A corresponds to FIG. 6E. Hereinafter, detailed descriptions about the same configurations as those described with reference to FIGS. 3 to 6E will be omitted.

As illustrated in FIG. 7A, the first color filter CF-R corresponding to the first light emitting area PXA-R1 and the fourth light emitting area PXA-R2 may have an integrated shape.

An opening OP-CR (hereinafter, also referred to as a color opening), which corresponds to the fifth light emitting area PXA-G1 and exposes the third color filter CF-G1, is defined in the first color filter CF-R. FIG. 7B illustrates the shape of the first color filter CF-R on the basis of FIG. 3. With reference to FIG. 7B, the first color filter CF-R, which has an integrated shape with respect to the plurality of light emitting areas PXA-R, PXA-G1, PXA-G2, and PXA-B, may be provided. Color openings OP-CR1 corresponding to the second color areas PXA-B and color openings OP-CR2 corresponding to the third color areas PXA-G1 and PXA-G2 may be defined in the first color filter CF-R.

With reference back to FIG. 7A, the color opening OP-CR has a larger area than the fifth light emitting area PXA-G1, and has a larger area than that of the fifth opening OP-BG1. The first color filter CF-R may include a first part P1 corresponding to the first light emitting area PXA-R1, a second part P2 corresponding to the fourth light emitting area PXA-R2, and a first bridge part P3 and a second bridge part P4 extending from the first part P1 to the second part P2. Unlike the illustrated in FIG. 6E, the first color CF-R surrounds the fifth opening OP-BG1. The first bridge part P3 and the second bridge part P4 are disposed between the edge of the partition pattern BM, which defines the fifth opening OP-BG1, and the second color filter CF-B.

As illustrated in FIG. 7C, a portion of the third color filter CF-G1 may be disposed on a portion of each of the second color filters CF-B1 and CF-B2 in the peripheral area NPXA. After the second color filters CF-B1 and CF-B2 are provided, the third color filter CF-G1 is provided. In the peripheral area NPXA, portions of the first and second bridge parts P3 and P4 may be respectively disposed on portions of the second color filters CF-B1 and CF-B2. In the peripheral area NPXA, each portion of the first and second bridge parts P3 and P4 may be disposed on the third color filter CF-G1. All of a portion of the first color filter CF-R, a portion of the second color filter CF-B1 and CF-B2, and a portion of the third color filter CF-G1 overlap each other on the partition pattern BM.

A formation order of the second color filters CF-B1 and CF-B2 and the third color filter CF-G1 is not limited. As illustrated in FIG. 7D, a portion of the second color filter CF-B1 and CF-B2 may be disposed on a portion of the third color filter CF-G1 in the peripheral area NPXA.

According to the illustrated in FIG. 8, unlike the illustrated in FIGS. 7A to 7D, a portion of the first and second bridge parts P3 and P4 may not overlap the second color filters CF-B1 and CF-B2 in the peripheral area NPXA. Any one between the two second color filters CF-B1 and CF-B2 may be defined as one side color filter CF-B1 (or a first color filter pattern), and the other may be defined as another side color filter CF-B2 (or a second color filter pattern).

In a plan view, the first bridge part P3 may be separated from the one side color filter CF-B1, and the second bridge part P4 may be separated from the other side color filter CF-B2. Through the separated areas, a portion of the third color filter CF-G1, which is disposed under the first color filter CF-R and the second color filters CF-B1 and CF-B2, may be exposed through the separated areas.

Figure 9:
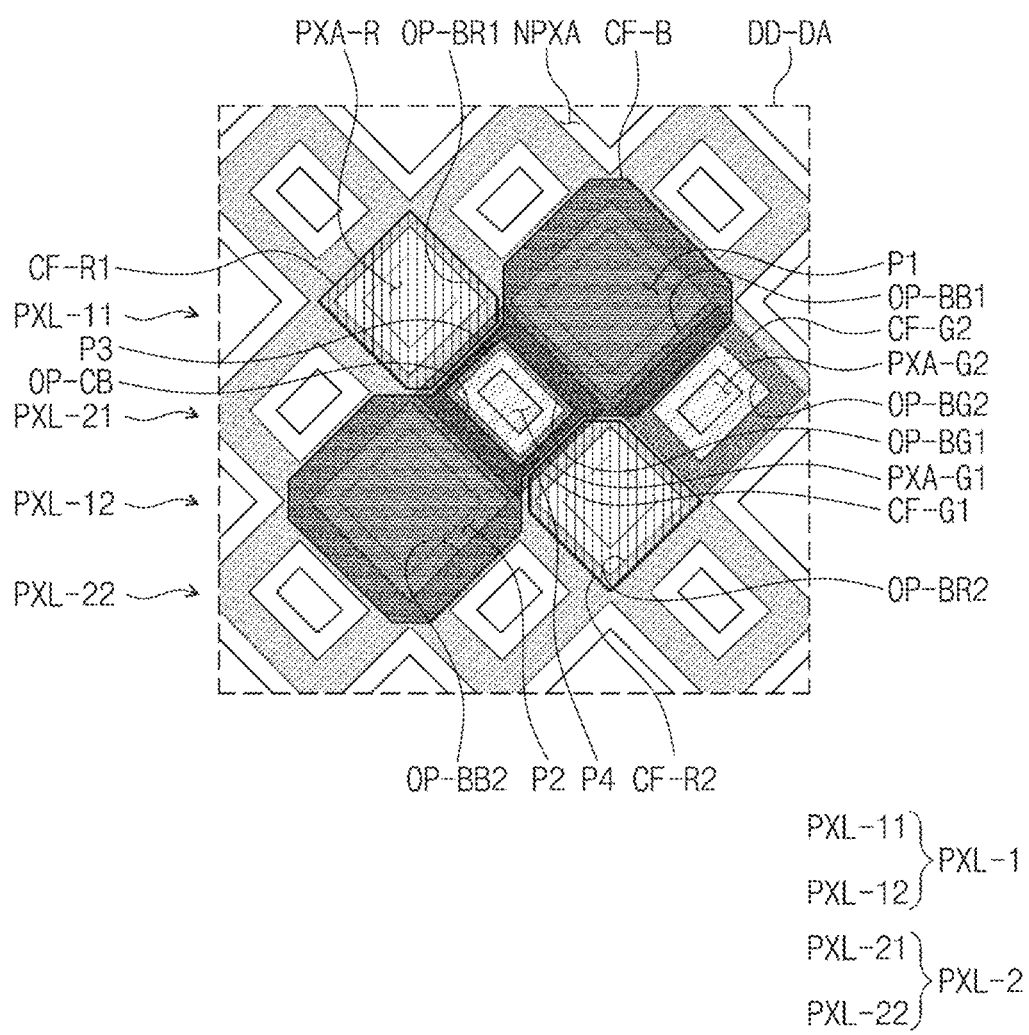
FIG. 9 is a plane view of an embodiment of a display area according to the invention.

FIG. 9 is a plane view of an embodiment of the display area DD-DA according to the invention. FIG. 9 corresponds to FIG. 7A. Hereinafter, a description will be provided on the basis of different components from the components described with reference to FIGS. 7A to 8.

In the illustrated embodiment, the second color filter CF-B corresponding to the second light emitting area PXA-B1 and the third light emitting area PXA-B2 may have an integrated shape. A color opening OP-CB, which corresponds to the fifth light emitting area PXA-G1 and exposes the third color filter CF-G1, is defined in the second color filter CF-B.

Although not separately illustrated, color openings corresponding to the first color areas PXA-R (refer to FIG. 3) and color openings corresponding to the third color areas PXA-G1 and PXA-G2 may be defined in the second color filter CF-B.

A portion of the second color filter CF-B, which overlaps the partition pattern BM, covers a portion of the third color filter CF-G1. The second color filter CF-B may include the first bridge part P3 and the second bridge part P4. The first bridge part P3 and the second bridge part P4 are illustrated to overlap the first color filters CF-R1 and CF-R2, but the invention is not limited thereto. A lamination order of the second color filter CF-B and the first color filters CF-R1 and CF-R2 is not limited.

According to the embodiments of the invention, the reflection prevention unit including a color filter may replace the film-type reflection prevention unit. Accordingly, the display device may become more flexible. In the foldable display device, deformation and damage in the folding area may be reduced, Since the first to third color filters have the above-described disposition relationships, black color sense, which is represented in a state in which the display device is turned off, may get close to more pure black.

While this invention has been described with reference to embodiments thereof, it will be clear to those of ordinary skill in the art to which the invention pertains that various changes and modifications may be made to the described embodiments without departing from the spirit and technical area of the invention as defined in the appended claims and their equivalents.

Thus, the scope of the invention shall not be restricted or limited by the foregoing description.

What is claimed is:
1. A display device comprising:
a display panel comprising a first pixel row comprising a first light emitting area which emits first color light and a second light emitting area which emits second color light, a second pixel row comprising a third light emitting area which emits the second color light and is arranged with the first light emitting area within a column direction and a fourth light emitting area which emits the first color light and is arranged with the second light emitting area within the column direction, a third pixel row disposed between the first pixel row and the second pixel row and comprising fifth and sixth light emitting areas, each of which emits third color light, and a peripheral area adjacent to the first, second, third, fourth, fifth, and sixth light emitting areas; and
a reflection prevention unit disposed on the display panel, the reflection prevention unit comprising:
a partition pattern which overlaps the peripheral area, and in which first, second, third, fourth, fifth, and sixth openings respectively corresponding to the first, second, third, fourth, fifth, and sixth light emitting areas are defined;
a first color filter overlapping the first light emitting area and the fourth light emitting area;
a second color filter overlapping the second light emitting area and the third light emitting area; and
a third color filter overlapping the fifth light emitting area and the sixth light emitting area,
wherein the first color light is red light, the second color light is blue light, and the third color light is green light,
wherein a portion of the first color filter, which is disposed in the peripheral area, is disposed on an uppermost upper surface of the third color filter which is most distant from the display panel than any other upper surface defining the third color filter and overlaps the third color filter.

2. The display device of claim 1, wherein a portion of the second color filter, which is disposed in the peripheral area, is disposed on the third color filter and overlaps the third color filter.

3. The display device of claim 1, wherein a size of the first light emitting area is smaller than a size of the second light emitting area and a size of the third light emitting area, and larger than a size of the fifth light emitting area and a size of the sixth light emitting area.

4. The display device of claim 1, wherein the display device is foldable.

5. The display device of claim 1, further comprising:
an input sensor which is disposed between the display panel and the reflection prevention unit, and provides a base surface.

6. The display device of claim 5, wherein the partition pattern contacts the base surface, and
each of a portion of the first color filter, a portion of the second color filter, and a portion of the third color filter, which are disposed in the peripheral area, overlaps the partition pattern.

7. The display device of claim 5, wherein a portion of the third color filter, which is disposed in the peripheral area, is disposed on the partition pattern, and
a portion of the first color filter, which is disposed in the peripheral area, overlaps the portion of the third color filter.

8. The display device of claim 1, wherein the fifth light emitting area is disposed inside an area defined by the first light emitting area, the second light emitting area, the third light emitting area, and the fourth light emitting area, and
an opening which corresponds to the fifth light emitting area and exposes the third color filter is defined in the first color filter.

9. The display device of claim 8, wherein the first color filter comprises a first part corresponding to the first light emitting area, a second part corresponding to the fourth light emitting area, and first and second bridge parts extending from the first part to the second part.

10. The display device of claim 9, wherein the second color filter comprises one side color filter corresponding to the second light emitting area and another side color filter corresponding to the third light emitting area, and
the one side color filter and the other side color filter are separated with the first and second bridge parts therebetween.

11. The display device of claim 10, wherein the one side color filter is separated from the first and second bridge parts in a plan view, and
a portion of the third color filter is exposed from the first color filter and the second color filter through a separated area defined between the one side color filter and the first and second bridge parts.

12. A display device comprising:
a display panel comprising first group pixel rows, each of the first group pixel rows comprising a first light emitting area which emits red light and a second light emitting area which emits blue light, and second group pixel rows, each of the second group pixel rows comprising a third light emitting area and a fourth light emitting area which emit green light, wherein the second group pixel rows are alternately arranged with the first group pixel rows within a column direction crossing an extension direction of the first group pixel rows; and
a reflection prevention unit disposed on the display panel, the reflection prevention unit comprising:
a first color filter overlapping the first light emitting area;
a second color filter overlapping the second light emitting area; and
a third color filter overlapping the third light emitting area and the fourth light emitting area,
wherein an opening corresponding to the third light emitting area is defined in at least one of the first color filter and the second color filter, and
a color filter in which the opening is defined among the first color filter and the second color filter is disposed on the third light emitting area.

13. The display device of claim 12, wherein the opening is defined in the first color filter, and
an opening corresponding to the fourth light emitting area is defined in the first color filter.

14. The display device of claim 12, wherein the third light emitting area is separated from the first light emitting area in a cross direction crossing the column direction and the extension direction.

15. The display device of claim 12, wherein the first group pixel rows comprises a first pixel row and a second pixel row alternately disposed in the column direction, and
the first pixel row and the second pixel row have a different disposition order of the first light emitting area and the second light emitting area within the extension direction from each other.

16. The display device of claim 15, wherein the second color filter corresponding to the first pixel row is separated from the second color filter corresponding to the second pixel row.

17. The display device of claim 12, wherein shapes of the third light emitting area and the fourth light emitting area are different from each other in a plan view.

18. A display device comprising:
a display panel comprising first pixel row and second pixel row comprising red light emitting areas and blue light emitting areas alternately disposed along a row direction, and a third pixel row comprising a plurality of green light emitting areas which emit green light and are disposed between the first pixel row and second pixel row within a column direction crossing the row direction; and
a reflection prevention unit disposed on the display panel, the reflection prevention unit comprising:
a red color filter overlapping the red light emitting areas;
a blue color filter overlapping the blue light emitting areas; and
a green color filter overlapping the green light emitting areas,
wherein a plurality of openings corresponding to the green light emitting areas is defined in the red color filter, and
the red color filter is disposed on an uppermost upper surface of the green color filter which is most distant from the display panel than any other upper surface defining the green color filter.

19. The display device of claim 18, wherein a disposition order of the red light emitting areas and the blue light emitting areas in the first pixel row is different from a disposition order of the red light emitting areas and the blue light emitting areas in the second pixel row.

\* \* \* \* \*